United States Patent
Shigematsu et al.

(12) 
(10) Patent No.: US 7,154,585 B2
(45) Date of Patent: Dec. 26, 2006

(54) PROJECTION OPTICAL SYSTEM, EXPOSURE APPARATUS, AND DEVICE PRODUCTION METHOD

(75) Inventors: Koji Shigematsu, Kawasaki (JP); Youhei Fujishima, Ageo (JP); Yasuhiro Omura, Kumagaya (JP); Toshiro Ishiyama, Saitama (JP)

(73) Assignee: Nikon Corporation, Tokyo (JP)

(*) Notice: Subject to any disclaimer, the term of this patent is extended or adjusted under 35 U.S.C. 154(b) by 513 days.

(21) Appl. No.: 10/611,966

(22) Filed: Jul. 3, 2003

(65) Prior Publication Data

US 2004/0009415 A1   Jan. 15, 2004

(30) Foreign Application Priority Data

Jul. 4, 2002 (JP) ............................. 2002-196212
Jan. 10, 2003 (JP) ............................. 2003-003869

(51) Int. Cl.
*G03B 27/54* (2006.01)
*G02B 9/00* (2006.01)
(52) U.S. Cl. ...................... 355/67; 359/649
(58) Field of Classification Search .................. 355/67; 359/649, 362, 642, 650, 651
See application file for complete search history.

(56) References Cited

U.S. PATENT DOCUMENTS

| 5,831,715 | A | 11/1998 | Takahashi |
| 6,333,781 | B1 | 12/2001 | Shigematsu |
| 6,862,078 | B1 * | 3/2005 | Suzuki ................. 355/67 |
| 6,864,961 | B1 * | 3/2005 | Omura ................. 355/67 |

FOREIGN PATENT DOCUMENTS

| EP | 1 139 138 A1 | 10/2001 |
| JP | A 11-352012 | 12/1999 |
| JP | A 200-75493 | 3/2000 |
| WO | WO 00/33138 | 6/2000 |
| WO | WO 02/31870 A1 | 4/2002 |

* cited by examiner

*Primary Examiner*—Rodney Fuller
(74) *Attorney, Agent, or Firm*—Oliff & Berridge, PLC

(57) ABSTRACT

Provided is a projection optical system for forming an image of a pattern of a first object (R) on a second object (W). The projection optical system is made of an optical material having a refractive index of not more than 1.6 and is substantially telecentric both on the first object side and on the second object side. The projection optical system satisfies the condition of $(\lambda \times L)/(NA \times Y_0^2) < 1.5 \times 10^{-3}$, where $\lambda$ is a wavelength of light, L a distance between the first object and the second object, MA a numerical aperture on the second object side, and $Y_0$ a maximum image height on the second object.

46 Claims, 20 Drawing Sheets

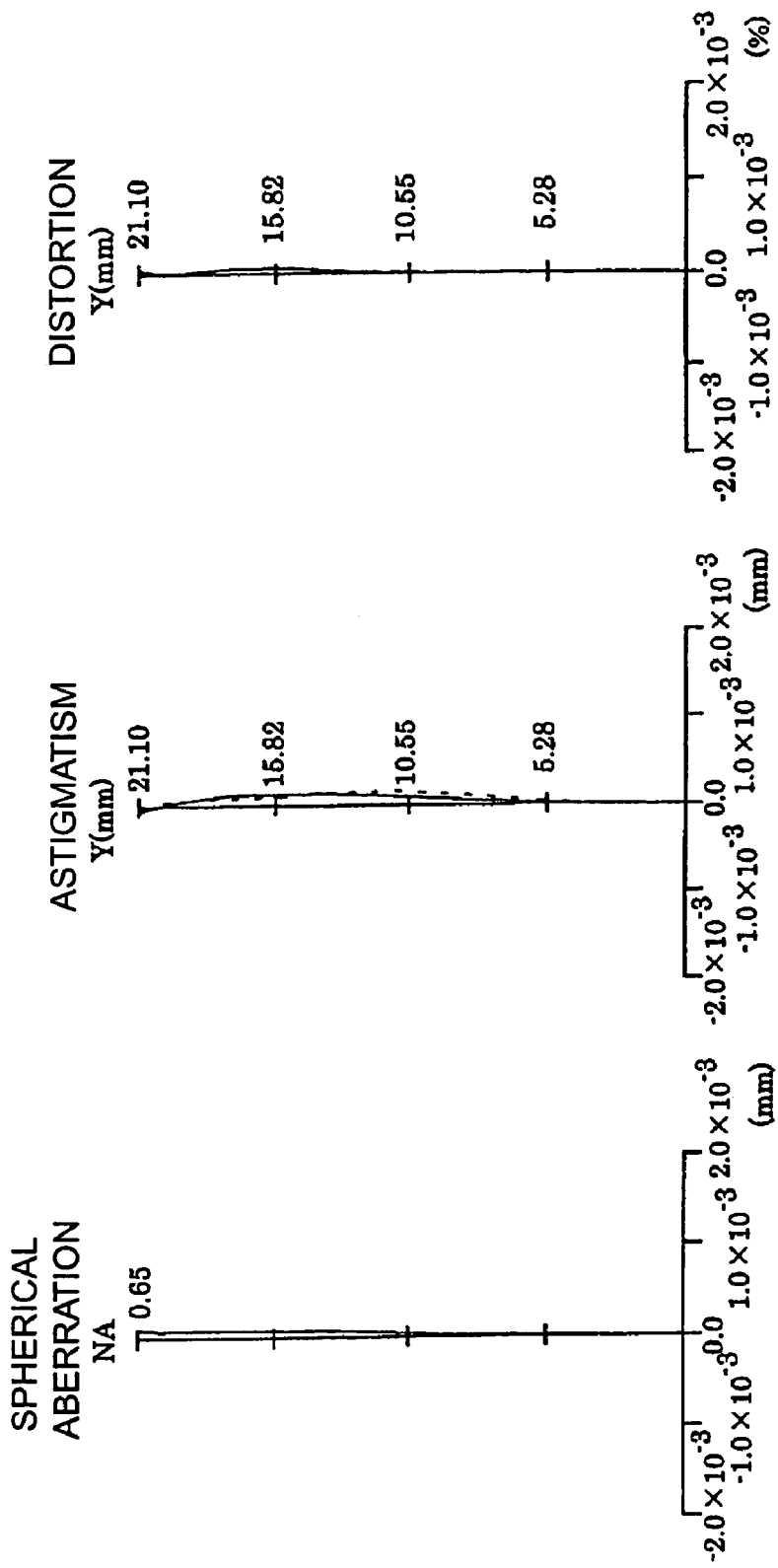

PROJECTION OPTICAL SYSTEM, EXPOSURE APPARATUS, AND DEVICE PRODUCTION METHOD

BACKGROUND OF THE INVENTION

1. Field of the Invention

The present invention relates to a projection optical system, an exposure apparatus, and a device production method and, more particularly, to a projection optical system suitably applicable to exposure apparatus used in production of microdevices such as semiconductor devices and liquid crystal display devices by photolithography.

2. Related Background Art

For producing the semiconductor devices and others, the exposure apparatus is used for transferring an image of a pattern on a reticle as a mask through the projection optical system onto a wafer (or a glass plate or the like) coated with a photoresist. Concerning the exposure apparatus of this type, there are increasing demands for improvement in the resolving power of the projection optical system, with progress in miniaturization of patterns of semiconductor integrated circuits or the like. A potential way for the improvement in the resolving power of the projection optical system is to decrease the wavelength of exposure light or to increase the numerical aperture.

In recent years, the exposure light is shifting from the g line (436 nm) and the i line (365 nm) of the mercury lamp to the KrF excimer laser beam (248 nm) and ArF excimer laser beam (193 nm) of shorter wavelengths. The shift into shorter wavelengths of exposure light for the improvement in the resolving power of the projection optical system will result in limiting types of optical materials with required transmittance that can be used for optical members constituting the projection optical system, and eventually making the design of the projection optical system difficult. Specifically, in the case of the projection optical system using the KrF excimer laser beam or the ArF excimer laser beam, available optical materials are substantially limited to silica, fluorite, or the like.

In the projection optical systems, demands for reduction of image distortion also become stronger and stronger with improvement in the resolving power. The image distortion herein involves one due to distortion of the projection optical system, one due to a warp or the like of a wafer set at the image plane of the projection optical system and exposed to the reticle pattern, and one due to a warp of the reticle set at the object plane of the projection optical system and provided with a circuit pattern or the like drawn therein.

SUMMARY OF THE INVENTION

In the prior art, as described above, the demands for reduction of image distortion become stronger and stronger with miniaturization of the transfer pattern. In order to reduce influence of the warp of the wafer on the image distortion, proposals have been made on a so-called image-side telecentric projection optical system in which the exit pupil of the projection optical system was located far from the image plane. In order to relieve the image distortion due to the warp of the reticle, proposals also have been made on locating the entrance pupil of the projection optical system relatively far from the object plane.

The various proposals have been made heretofore on the projection optical systems with high resolving power in the prior art, but they failed to secure a sufficiently wide, effective exposure area (image field: imaging area). For this reason, projection exposure was conducted by the so-called step-and-scan method in which the reticle and wafer were moved relative to the projection optical system to effect scanning exposure of the reticle pattern to each exposure area of the wafer, and it was infeasible to achieve a satisfactorily high throughput. In order to realize such high-throughput exposure apparatus, there are desires for securing a wider image field on the wafer, i.e., for widening of the field.

As described above, the decrease in the wavelength of exposure light for the improvement in the resolving power poses the problem of the decrease in the transmittance of the optical materials forming the projection optical system and results in limiting types of available optical materials for securing high transmittance. Furthermore, the decrease of transmittance does not cause only loss in quantity of light, but also causes the following disadvantage: part of dissipative light is absorbed by the optical members and the absorbed light turns into heat to cause change in the refractive indices of the optical members or deformation of optical surfaces (lens surfaces), which can result in degrading the imaging performance of the projection optical system.

Correction for aberration is necessary for the widening of the field and the increase of the resolving power, but it is extremely difficult to make correction for aberration throughout the whole of the wide exposure area with use of the limited types of optical materials.

The present invention has been accomplished in view of the foregoing problems and an object of the invention is to provide a compact, high-performance projection optical system that decreases the image distortion, while securing a satisfactorily large numerical aperture and a satisfactorily wide imaging area.

Another object of the present invention is to provide an exposure apparatus that is able to implement excellent projection exposure with a high throughput and a high resolving power, using the compact, high-performance projection optical system. A further object of the present invention is to provide a device production method that can produce an excellent microdevice, using the exposure apparatus capable of implementing excellent projection exposure with a high throughput and a high resolving power.

In order to solve the above problems, a first aspect of the present invention provides a projection optical system for forming an image of a pattern of a first object on a second object, the projection optical system being made of an optical material having a refractive index of not more than 1.6 and being substantially telecentric both on the first object side and on the second object side, the projection optical system satisfying the condition below:

$$(\lambda \times L)/(NA \times Y_0^2) < 1.5 \times 10^{-3},$$

where $\lambda$ is a wavelength of light (radiation), L a distance between the first object and the second object, NA a numerical aperture on the second object side, and $Y_0$ a maximum image height on the second object.

In a preferred embodiment of the first aspect, the projection optical system satisfies the condition of E/L>1.2, where E is a distance between an exit pupil of the projection optical system and the second object and L the distance between the first object and the second object. Preferably, all optical members constituting the projection optical system are made of an optical material of a single kind. Furthermore, preferably, at least one optical surface is formed in an aspherical shape.

A second aspect of the present invention provides a projection optical system for forming an image of a pattern of a first object on a second object, the projection optical system being made of an optical material having a refractive index of not more than 1.6 and being substantially telecentric both on the first object side and on the second object side, wherein at least one optical surface is formed in an aspherical shape, the projection optical system satisfying the conditions below:

$$(\lambda \times L)/(NA \times Y_0^2) < 1.0 \times 10^{-3}, \text{ and}$$

$$\lambda < 200 \text{ nm},$$

where $\lambda$ is a wavelength of light (radiation), L a distance between the first object and the second object, NA a numerical aperture on the second object side, and $Y_0$ a maximum image height on the second object.

A third aspect of the present invention provides a projection optical system comprising the following lens units in order from the side of a first object: a first lens unit having a positive refracting power, a second lens unit having a negative refracting power, and a third lens unit having a positive refracting power, and configured to form an image of a pattern of the first object on a second object, the projection optical system satisfying the condition below:

$$0.014 < Y_0/L < 0.030,$$

where $Y_0$ is a maximum image height on the second object and L a distance between the first object and the second object.

In a preferred embodiment of the third aspect, where $H_0$ represents a maximum object height on the first object, 80% or more of the total number of optical surfaces constituting the first lens unit have a clear aperture radius larger than 1.1 times the maximum object height $H_0$, 80% or more of the total number of optical surfaces constituting the second lens unit have a clear aperture radius smaller than 1.1 times the maximum object height $H_0$, and 70% or more of the total number of optical surfaces constituting the third lens unit have a clear aperture radius larger than 1.1 times the maximum object height $H_0$. Preferably, the first lens unit is located nearest to the first object out of the lens units belonging to the projection optical system, and the third lens unit is located nearest to the second object out of the lens units belonging to the projection optical system.

A fourth aspect of the present invention provides an exposure apparatus comprising an illumination system for illuminating a mask as the first object, and the projection optical system according to one of the first aspect to the third aspect, for forming an image of a pattern formed on the mask, on a photosensitive substrate as the second object. In this case, preferably, exposure is carried out in a state in which the mask and the photosensitive substrate are stationary relative to each other with respect to a transverse direction to the optical axis of the projection optical system.

A fifth aspect of the present invention provides a device production method comprising an illumination step of illuminating a mask as the first object; an exposure step of exposing a pattern of the mask illuminated by the illumination step, onto a photosensitive substrate as the second object by way of the projection optical system according to one of the first aspect to the third aspect; and a development step of developing the photosensitive substrate exposed by the exposure step. In this case, preferably, the exposure step is to effect exposure in a state in which the mask and the photosensitive substrate are stationary relative to each other with respect to a transverse direction to the optical axis of the projection optical system.

A sixth aspect of the present invention provides an exposure apparatus for implementing projection exposure of a pattern on a mask onto a photosensitive substrate, comprising an illumination system for illuminating the mask; and a projection optical system for forming a reduced image of the pattern of the mask on the photosensitive substrate, wherein the projection optical system is made of an optical material having a refractive index of not more than 1.6 and is substantially telecentric both on the mask side and on the photosensitive substrate side, and wherein the projection optical system satisfies the condition below:

$$(\lambda \times L)/(NA \times Y_0^2) < 1.5 \times 10^{-3},$$

where $\lambda$ is a wavelength of light (radiation) from the illumination system, L a distance between the mask and the image of the mask, NA a numerical aperture on the photosensitive substrate side, and $Y_0$ a maximum image height on the photosensitive substrate.

A seventh aspect of the present invention provides an exposure method of implementing projection exposure of a pattern on a mask onto a photosensitive substrate, comprising an illumination step of illuminating the mask with use of an illumination system; and a projection step of forming a reduced image of the pattern of the mask on the photosensitive substrate with use of a projection optical system, wherein the projection optical system is made of an optical material having a refractive index of not more than 1.6 and is substantially telecentric both on the mask side and on the photosensitive substrate side, and wherein the projection optical system satisfies the condition below:

$$(\lambda \times L)/(NA \times Y_0^2) < 1.5 \times 10^{-3},$$

where $\lambda$ is a wavelength of light (radiation) from the illumination system, L a distance between the mask and the image of the mask, NA a numerical aperture on the photosensitive substrate side, and $Y_0$ a maximum image height on the photosensitive substrate.

An eighth aspect of the present invention provides an exposure apparatus for implementing projection exposure of a pattern on a mask onto a photosensitive substrate, comprising an illumination system for illuminating the mask; and a projection optical system for forming a reduced image of the pattern of the mask on the photosensitive substrate, wherein the projection optical system is made of an optical material having a refractive index of not more than 1.6 and is substantially telecentric both on the mask side and on the photosensitive substrate side, wherein at least one optical surface of the projection optical system is formed in an aspherical shape, and wherein the projection optical system satisfies the conditions below:

$$(\lambda \times L)/(NA \times Y_0^2) < 1.0 \times 10^{-3}, \text{ and}$$

$$\lambda < 200 \text{ nm},$$

where $\lambda$ is a wavelength of light (radiation) from the illumination system, L a distance between the mask and the image of the mask, NA a numerical aperture on the photosensitive substrate side, and $Y_0$ a maximum image height on the photosensitive substrate.

A ninth aspect of the present invention provides an exposure method of implementing projection exposure of a pattern on a mask onto a photosensitive substrate, comprising an illumination step of illuminating the mask with use of an illumination system; and a projection step of forming a reduced image of the pattern of the mask on the photosensitive substrate with use of a projection optical system, wherein the projection optical system is made of an optical material having a refractive index of not more than 1.6 and is substantially telecentric both on the mask side and on the photosensitive substrate side, and wherein the projection optical system satisfies the conditions below:

$(\lambda \times L)/(NA \times Y_0^2) < 1.0 \times 10^{-3}$, and $\lambda < 200$ nm, where $\lambda$ is a wavelength of light (radiation) from the illumination system, L a distance between the mask and the image of the mask, NA a numerical aperture on the photosensitive substrate side, and $Y_0$ a maximum image height on the photosensitive substrate.

A tenth aspect of the present invention provides an exposure apparatus for implementing projection exposure of a pattern on a mask onto a photosensitive substrate, comprising an illumination system for illuminating the mask positioned on a first surface; and a projection optical system for forming a reduced image of the pattern of the mask on the photosensitive substrate positioned on a second surface, wherein the projection optical system comprises a first lens unit located in an optical path between the first surface and the second surface and having a positive refracting power; a second lens unit located in an optical path between the first lens unit and the second surface and having a negative refracting power; and a third lens unit located in an optical path between the second lens unit and the second surface and having a positive refracting power, and wherein the projection optical system satisfies the condition below:

$0.014 < Y_0/L < 0.030$, where $Y_0$ is a maximum image height on the photosensitive substrate and L a distance between the mask and the photosensitive substrate.

An eleventh aspect of the present invention provides an exposure method of implementing projection exposure of a pattern on a mask onto a photosensitive substrate, comprising a step of positioning the mask on a first surface; a step of positioning the photosensitive substrate on a second surface; an illumination step of illuminating the mask; and a projection step of forming a reduced image of the pattern of the mask on the photosensitive substrate with use of a projection optical system, wherein the projection optical system comprises a first lens unit located in an optical path between the first surface and the second surface and having a positive refracting power; a second lens unit located in an optical path between the first lens unit and the second surface and having a negative refracting power; and a third lens unit located in an optical path between the second lens unit and the second surface and having a positive refracting power, and wherein the projection optical system satisfies the condition below:

$0.014 < Y_0/L < 0.030$, where $Y_0$ is a maximum image height on the photosensitive substrate and L a distance between the mask and the photosensitive substrate.

In each of the aspects of the present invention described above, the projection optical system preferably satisfies the condition of $(\lambda \times L)/(NA \times S) < 4.5 \times 10^{-4}$, instead of the condition of $(\lambda \times L)/(NA \times Y_0^2) < 1.5 \times 10^{-3}$. In the condition, $\lambda$ represents the wavelength of light (radiation), L the distance between the first object and the second object, NA the numerical aperture on the second object side, and S an area of an imaging area on the second object.

BRIEF DESCRIPTION OF THE DRAWINGS

FIGS. 4A–4E are drawings showing transverse aberration in the first embodiment, wherein FIG. 4A shows the transverse aberration at 100% image height (the horizontal axis: tangential and the horizontal axis: sagittal), FIG. 4B the transverse aberration at 75% image height (the horizontal axis: tangential and the horizontal axis: sagittal), FIG. 4C the transverse aberration at 50% image height (the horizontal axis: tangential and the horizontal axis: sagittal), FIG. 4D the transverse aberration at 25% image height (the horizontal axis: tangential and the horizontal axis: sagittal), and FIG. 4E the transverse aberration at 0% image height (the horizontal axis: tangential and the horizontal axis: sagittal).

FIGS. 6A–6C are drawings showing spherical aberration, astigmatism, and distortion, respectively, in the second embodiment.

FIGS. 7A–7E are drawings showing transverse aberration in the second embodiment, wherein FIG. 7A shows the transverse aberration at 100% image height (the horizontal axis: tangential and the horizontal axis: sagittal), FIG. 7B the transverse aberration at 75% image height (the horizontal axis: tangential and the horizontal axis: sagittal), FIG. 7C the transverse aberration at 50% image height (the horizontal axis: tangential and the horizontal axis: sagittal), FIG. 7D the transverse aberration at 25% image height (the horizontal axis: tangential and the horizontal axis: sagittal), and FIG. 7E the transverse aberration at 0% image height (the horizontal axis: tangential and the horizontal axis: sagittal).

FIGS. 10A–10E are drawings showing transverse aberration in the third embodiment, wherein FIG. 10A shows the transverse aberration at 100% image height (the horizontal axis: tangential and the horizontal axis: sagittal), FIG. 10B the transverse aberration at 75% image height (the horizontal axis: tangential and the horizontal axis: sagittal), FIG. 10C the transverse aberration at 50% image height (the horizontal axis: tangential and the horizontal axis: sagittal), FIG. 10D the transverse aberration at 25% image height (the horizontal axis: tangential and the horizontal axis: sagittal), and FIG. 10E the transverse aberration at 0% image height (the horizontal axis: tangential and the horizontal axis: sagittal).

FIGS. 13A–13E are drawings showing transverse aberration in the fourth embodiment, wherein FIG. 13A shows the transverse aberration at 100% image height (the horizontal axis: tangential and the horizontal axis: sagittal), FIG. 13B the transverse aberration at 75% image height (the horizontal axis: tangential and the horizontal axis: sagittal), FIG. 13C the transverse aberration at 50% image height (the horizontal axis: tangential and the horizontal axis: sagittal), FIG. 13D the transverse aberration at 25% image height (the horizontal axis: tangential and the horizontal axis: sagittal), and FIG. 13E the transverse aberration at 0% image height (the horizontal axis: tangential and the horizontal axis: sagittal).

FIGS. 16A–16E are drawings showing transverse aberration in the fifth embodiment, wherein FIG. 16A shows the transverse aberration at 100% image height (the horizontal axis: tangential and the horizontal axis: sagittal), FIG. 16B the transverse aberration at 75% image height (the horizontal axis: tangential and the horizontal axis: sagittal), FIG. 16C the transverse aberration at 50% image height (the horizontal axis: tangential and the horizontal axis: sagittal), FIG. 16D the transverse aberration at 25% image height (the horizontal axis: tangential and the horizontal axis: sagittal), and FIG. 16E the transverse aberration at 0% image height (the horizontal axis: tangential and the horizontal axis: sagittal).

FIGS. 18A–18C are drawings showing transverse aberration in the sixth embodiment, wherein FIG. 18A shows the transverse aberration at 100% image height (the horizontal axis: tangential and the horizontal axis: sagittal), FIG. 18B the transverse aberration at 50% image height (the horizontal axis: tangential and the horizontal axis: sagittal), FIG. 18C the transverse aberration at 0% image height (the horizontal axis: tangential and the horizontal axis: sagittal).

DESCRIPTION OF THE PREFERRED EMBODIMENTS

Figure 1:
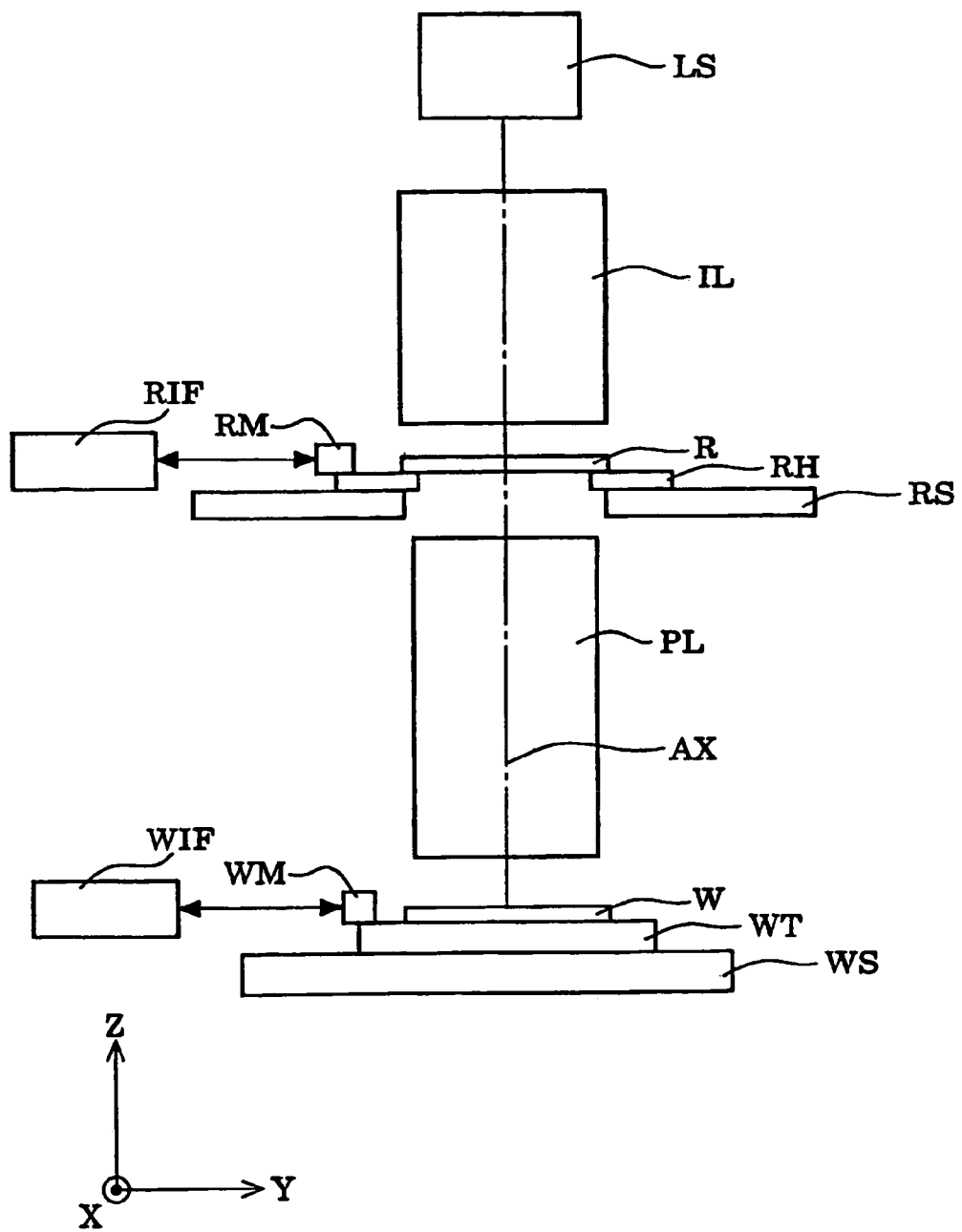
FIG. 1 is a drawing schematically showing the structure of an exposure apparatus with the projection optical system according to an embodiment of the present invention.

Since the projection optical system of the present invention is made of an optical material having the refractive index of not more than 1.6, i.e., an optical material having a relatively low refractive index, it can secure high transmittance for light of short wavelengths. Since the projection optical system of the present invention is constructed as an optical system substantially telecentric both on the object side (first object side) and on the image side (second object side), it can hold down the influence on the image distortion on the first object side (the image distortion due to the warp of the reticle or the like when applied to the exposure apparatus) and the influence on the image distortion on the second object side (the image distortion due to the warp of the wafer or the like when applied to the exposure apparatus).

The projection optical system of the present invention satisfies the following conditional expression (1). In Conditional Expression (1), $\lambda$ is the wavelength of light (radiation), and L the distance between the first object and the second object. Furthermore, NA represents the numerical aperture on the second object side, and $Y_0$ the maximum image height on the second object.

$$(\lambda \times L)/(NA \times Y_0^2) < 1.5 \times 10^{-3} \quad (1)$$

When the projection optical system satisfies the conditional expression (1), it is feasible to realize the compact, high-performance projection optical system while securing a high resolving power and a wide imaging area (an area on the image plane where aberration is corrected for in a required condition: a wide exposure area in application to the exposure apparatus), and it is feasible to implement projection exposure with a high throughput by the projection optical system when mounted on the exposure apparatus. On the other hand, if the left side in the conditional expression (1) exceeds the upper limit, the resolving power or the imaging area will become insufficient, or the optical system will become too big to substantialize.

In order to guarantee the beneficial effect of the present invention, the upper limit of the conditional expression (1) is preferably set to $1.3 \times 10^{-3}$.

Alternatively, the projection optical system of the present invention preferably satisfies the following conditional expression, in order to achieve the beneficial effect of the present invention. The upper limit of the following conditional expression is more preferably set to $3.9 \times 10^{-4}$.

$$(\lambda \times L)/(NA \times S) < 4.5 \times 10^{-4}$$

In the above expression, $\lambda$ represents the wavelength of light (radiation), L the distance between the first object and the second object, NA the numerical aperture on the second object side, and S the area of the imaging area on the second object.

The projection optical system of the present invention desirably satisfies the following conditional expression (2). In the conditional expression (2), E represents the distance between the exit pupil of the projection optical system and the second object.

$$E/L > 1.2 \quad (2)$$

The conditional expression (2) is a conditional expression for defining compactness and telecentricity on the second object side. Here the telecentricity on the second object side is more important than the telecentricity on the first object side (reticle side) when the system is mounted on the exposure apparatus. When the projection optical system satisfies the conditional expression (2), it can be a compact optical system, while substantially suppressing the influence on the image distortion on the second object side (the image distortion due to the warp of the wafer or the like in application to the exposure apparatus). On the other hand, if the left side (E/L) becomes smaller than the lower limit of the conditional expression (2), the influence will become greater on the image distortion on the second object side, or the optical system will become too big to substantialize, which is unfavorable.

In the projection optical system of the present invention, preferably, all the optical components are made of an optical material of a single kind. This configuration can reduce the production cost of the optical members and the load on production thereof. In the case of the projection optical system wherein all the optical components are made of an optical material of a single kind, for example as disclosed in U.S. Pat. No. 5,831,715, when there occurs variation in the atmospheric pressure of the projection optical system, change in the refractive index of the atmosphere due to the pressure change and, in turn, aberration variation due to the pressure change can be corrected for by shifting (or changing) the wavelength of light. Particularly, this technology has the effect of capability of correction for aberration variation by simply shifting the wavelength as disclosed in Japanese Patent Application Laid-Open No. Hei-11-352012 and Japanese Patent Application Laid-Open No. 2000-75493, in cases where adjustment and operation are made in different environments, e.g., in the case where the apparatus is installed at high altitude.

Furthermore, in the projection optical system of the present invention at least one optical surface is preferably formed in an aspherical shape. When an aspherical surface is introduced into the optical system in this way, excellent correction for aberration can be implemented throughout the whole of the wide imaging area (the exposure area in the case of the exposure apparatus).

As described above, the present invention has permitted implementation of the compact, high-performance projection optical system that decreases the image distortion, while securing the satisfactorily large numerical aperture and satisfactorily wide imaging area. Accordingly, the exposure apparatus equipped with the projection optical system of the present invention is able to implement excellent projection exposure with a high throughput and a high resolving power and, in turn, is able to produce excellent microdevices with a high throughput and a high resolving power.

Embodiments of the present invention will be described on the basis of the accompanying drawings.

FIG. 1 is a drawing schematically showing the structure of the exposure apparatus provided with the projection optical system according to an embodiment of the present invention. In FIG. 1, the Z axis is set parallel to the optical axis AX of the projection optical system PL, the Y axis parallel to the plane of FIG. 1 in the plane perpendicular to the optical axis AX, and the X-axis normal to the plane of FIG. 1 in the plane perpendicular to the optical axis AX.

The exposure apparatus shown in FIG. 1 is provided, for example, with a KrF excimer laser source (wavelength 248.4 nm), ArF excimer laser source (wavelength 193.3 nm), or $F_2$ laser source (wavelength 157.6 nm) as a light source (a radiation source) LS for supplying illumination light. Light emitted from the light source LS is guided through an illumination optical system IL to illuminate a reticle (mask) R as a projection original plate with a predetermined pattern formed therein. The illumination optical system IL is comprised of a fly's eye lens for uniformizing illuminance distribution of exposure light, an illumination aperture stop, a variable field stop (reticle blind), a condenser lens system, and so on.

The reticle R is held through a reticle holder RH in parallel with the XY plane on a reticle stage RS. The reticle stage RS is two-dimensionally movable along the reticle surface (i.e., the XY plane) through action of an unrepresented driving system and is configured so that coordinates of the location thereof are measured by an interferometer RIF using a reticle moving mirror RM and the location is controlled based thereon. Light from the pattern formed in the reticle R is guided through the projection optical system PL to form a reticle pattern image on a wafer W (photosensitive substrate) coated with a photoresist.

The projection optical system PL has a variable aperture stop AS (not shown in FIG. 1) disposed in the vicinity of the location of the pupil thereof and is substantially telecentric both on the reticle R side and on the wafer W side. An image of a secondary light source on the illumination pupil plane of the illumination optical system is formed at the position of the pupil of the projection optical system PL, and the wafer W is illuminated by Köhler illumination with the light having passed through the projection optical system PL. The wafer W is held through a wafer table (wafer holder) WT in parallel with the XY plane on a wafer stage WS.

The wafer stage WS is two-dimensionally movable along a wafer surface (i.e., the XY plane) through action of an unrepresented driving system and is configured so that coordinates of the location thereof are measured by an interferometer WIF using a wafer moving mirror WM and the location thereof is controlled based thereon. In the present embodiment, the pattern of the reticle R is sequentially exposed into each of exposure areas of wafer W by repeating an operation of implementing full-shot exposure of the pattern of the reticle R into each exposure area while two-dimensionally driving and controlling the wafer W in the plane perpendicular to the optical axis AX of the projection optical system PL, i.e., by the step-and-repeat method.

Each of embodiments of the projection optical system PL of the present embodiment will be described below on the basis of specific numerical examples.

In the first embodiment to the fourth embodiment, all the lens components constituting the projection optical system PL are made of silica ($SiO_2$) In the fifth embodiment, the lens components constituting the projection optical system PL are made of silica or fluorite ($CaF_2$). In the sixth embodiment, all the lens components constituting the projection optical system PL are made of fluorite. In the first embodiment to the third embodiment, the laser beam supplied from the KrF excimer laser source as a light source LS has the center wavelength of 248.4 nm and the silica glass has the refractive index of 1.50839 for the center wavelength. In the fourth embodiment and the fifth embodiment, the laser beam supplied from the ArF excimer laser source as a light source LS has the center wavelength of 193.3 nm, the silica glass has the refractive index of 1.560326 for the center wavelength, and fluorite has the refractive index of 1.501455 for the center wavelength. In the sixth embodiment, the laser beam supplied from the $F_2$ laser source as a light source LS has the center wavelength of 157.6 nm, and fluorite has the refractive index of 1.559307 for the center wavelength.

In each embodiment, an aspherical surface is expressed by Equation (a) below, where y is a height in the direction normal to the optical axis, z a distance (sag) along the optical axis from the tangential plane at the apex of the aspherical surface to a position on the aspherical surface at the height y, r a radius of curvature at the apex, k a conic coefficient, and $C_n$ an n-th aspheric coefficient. In Tables (1)–(6) presented hereinafter, a lens surface formed in an aspherical shape is given a mark * on the right side of a surface number.

$$z=(y^2/r)/[1+(1-(1+k)\cdot y^2/r^2)^{1/2}]+C_4\cdot y^4+C_6\cdot y^6+C_8\cdot y^8+C_{10}\cdot y^{10}+ \qquad (a)$$

[First Embodiment]

Figure 2:
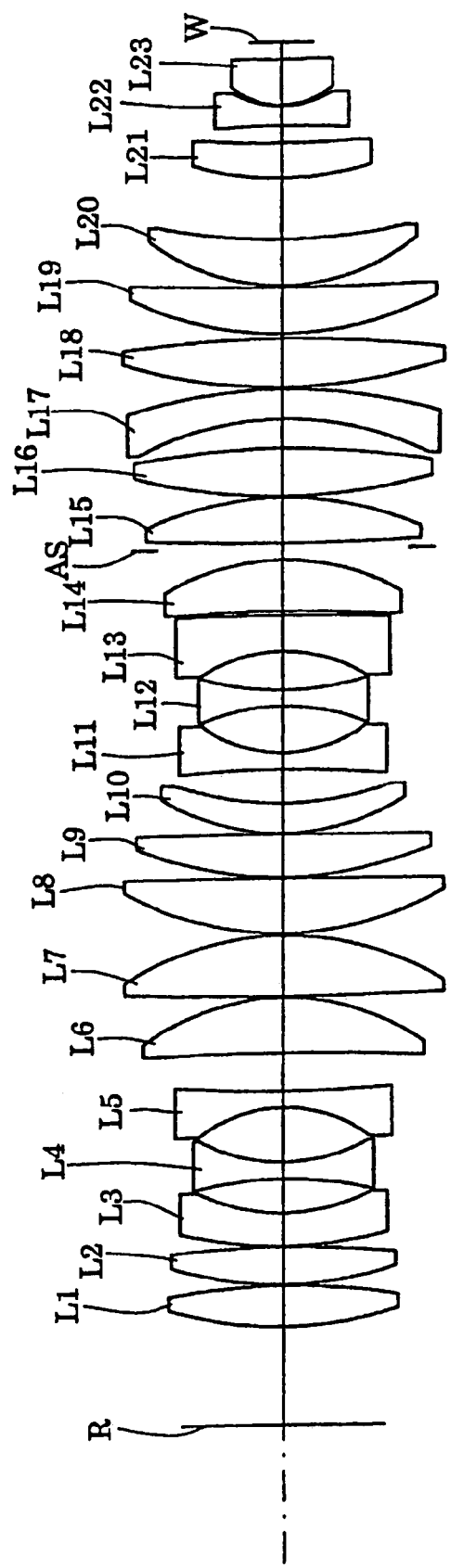
FIG. 2 is a drawing showing a lens setup of the projection optical system according to the first embodiment.

FIG. 2 is a drawing showing the lens setup of the projection optical system according to the first embodiment. With reference to FIG. 2, the projection optical system PL of the first embodiment is comprised of the following lenses named in order from the reticle side: biconvex lens L1, biconvex lens L2, negative meniscus lens L3 with a concave surface of aspherical shape facing the wafer side, biconcave lens L4, biconcave lens L5, positive meniscus lens L6 with a concave surface facing the reticle side, biconvex lens L7, plano-convex lens L8 with the plane facing the wafer side, plano-convex lens L9 with the plane facing the wafer side, positive meniscus lens L10 with a concave surface of aspherical shape facing the wafer side, biconvex lens L11, biconcave lens L12 with a concave surface of aspherical shape facing the wafer side, negative meniscus lens L13 with a concave surface facing the reticle side, positive meniscus lens L14 with a concave surface facing the reticle side, aperture stop AS, biconvex lens L15, biconvex lens L16, negative meniscus lens L17 with a concave surface facing the reticle side, biconvex lens L18, positive meniscus lens L19 with a convex surface facing the reticle side, positive meniscus lens L20 with a convex surface facing the reticle side, positive meniscus lens L21 with a concave surface of aspherical shape facing the wafer side, biconcave lens L22, and positive meniscus lens L23 with a convex surface facing the reticle side.

Table (1) below provides a list of values of specifications in the projection optical system according to the first embodiment. In the major specifications of Table (1), $\lambda$ represents the center wavelength of exposure light, $\beta$ a projection magnification (lateral magnification), NA the image-side (wafer-side) numerical aperture, and $Y_0$ the maximum image height (radius of the image field). In the specifications of the optical components in Table (1), each surface number represents an order of a surface from the reticle side, r a radius of curvature of each surface (in the case of an aspherical surface, it represents a radius of curvature at apex: mm), d a separation on the axis or surface separation of each surface (mm), and n a refractive index for the center wavelength of exposure light. The above notation also applies to Tables (2)–(6) presented hereinafter.

TABLE 1

(Major Specifications)

$\lambda$ = 248.4 nm
$\beta$ = −1/4
NA = 0.63
$Y_0$ = 21.1 mm (Specifications of Optical Members)

| Surface No. | r | d | n | |
|---|---|---|---|---|
| (Reticle surface) | | 85.356 | | |
| 1 | 336.044 | 37.114 | 1.50839 | (L1) |
| 2 | −615.588 | 1 | | |
| 3 | 316.94 | 33.74 | 1.50839 | (L2) |
| 4 | −989.58 | 1 | | |
| 5 | 359.629 | 30.296 | 1.50839 | (L3) |
| 6* | 159.197 | 30.838 | | |
| 7 | −337.919 | 15 | 1.50839 | (L4) |
| 8 | 156.559 | 49.488 | | |
| 9 | −124.689 | 15 | 1.50839 | (L5) |
| 10 | 1160.675 | 36.007 | | |
| 11 | −2954.93 | 51.128 | 1.50839 | (L6) |
| 12 | −209.121 | 1 | | |
| 13 | 2955.769 | 55.617 | 1.50839 | (L7) |
| 14 | −271.245 | 1.906 | | |
| 15 | 274.463 | 51.753 | 1.50839 | (L8) |
| 16 | ∞ | 1 | | |
| 17 | 324.91 | 40.148 | 1.50839 | (L9) |
| 18 | ∞ | 1 | | |
| 19 | 195.148 | 28.434 | 1.50839 | (L10) |
| 20* | 274.486 | 31.28 | | |

-continued

| Surface No. | r | d | n | |
|---|---|---|---|---|
| 21 | −989.419 | 15 | 1.50839 | (L11) |
| 22 | 117.522 | 43.78 | | |
| 23 | 183.081 | 15 | 1.50839 | (L12) |
| 24* | 257.814 | 36.097 | | |
| 25 | −136.607 | 33.693 | 1.50839 | (L13) |
| 26 | −3057.79 | 3.802 | | |
| 27 | −1540.04 | 47.077 | 1.50839 | (L14) |
| 28 | −207.905 | 10.539 | | |
| 29 | ∞ | 4.66 | | (AS) |
| 30 | 2195.041 | 42.729 | 1.50839 | (L15) |
| 31 | −290.604 | 1 | | |
| 32 | 488.043 | 44.596 | 1.50839 | (L16) |
| 33 | −776.102 | 26.234 | | |
| 34 | −290.901 | 27.5 | 1.50839 | (L17) |
| 35 | −487.976 | 1.919 | | |
| 36 | 478.702 | 42.713 | 1.50839 | (L18) |
| 37 | −1180.72 | 4.283 | | |
| 38 | 295.558 | 41.897 | 1.50839 | (L19) |
| 39 | 2379.702 | 1.727 | | |
| 40 | 191.779 | 40.82 | 1.50839 | (L20) |
| 41 | 501.27 | 52.63 | | |
| 42 | 271.114 | 29.675 | 1.50839 | (L21) |
| 43* | 966.299 | 14.707 | | |
| 44 | −1253.62 | 16.248 | 1.50839 | (L22) |
| 45 | 87.496 | 1 | | |
| 46 | 70.339 | 39.582 | 1.50839 | (L23) |
| 47 | 616.178 | 12.9803 | | |
| (Wafer surface) | | | | |

(Aspherical Data)

Surface 6

$\kappa = 0$
$C_4 = -3.2030 \times 10^{-8}$   $C_5 = -1.3280 \times 10^{-12}$
$C_8 = -5.4530 \times 10^{-17}$   $C_{10} = 1.8350 \times 10^{-21}$
$C_{12} = -4.4290 \times 10^{-25}$   $C_{14} = 1.2610 \times 10^{-29}$ Surface 20

$\kappa = 0$
$C_4 = -7.2400 \times 10^{-9}$   $C_6 = 1.6610 \times 10^{-14}$
$C_8 = 2.3820 \times 10^{-18}$   $C_{10} = -6.9760 \times 10^{-23}$
$C_{12} = 6.6230 \times 10^{-27}$ Surface 24

$\kappa = 0$
$C_4 = 4.2380 \times 10^{-8}$   $C_6 = -2.3110 \times 10^{-12}$
$C_8 = -2.6420 \times 10^{-17}$   $C_{10} = 4.7740 \times 10^{-21}$ Surface 43

$\kappa = 0$
$C_4 = 3.6730 \times 10^{-8}$   $C_6 = 4.4570 \times 10^{-13}$
$C_8 = 2.7930 \times 10^{-17}$   $C_{10} = -3.3130 \times 10^{-21}$
$C_{12} = 4.1110 \times 10^{-25}$ (Values corresponding to Conditional Expressions)

L = 1249.9933 mm
E = 3220.834 mm
(1) $(\lambda \times L)/(NA \times Y_6^2) = 1.107 \times 10^{-3}$
(2) E/L = 2.58

Figure 3:
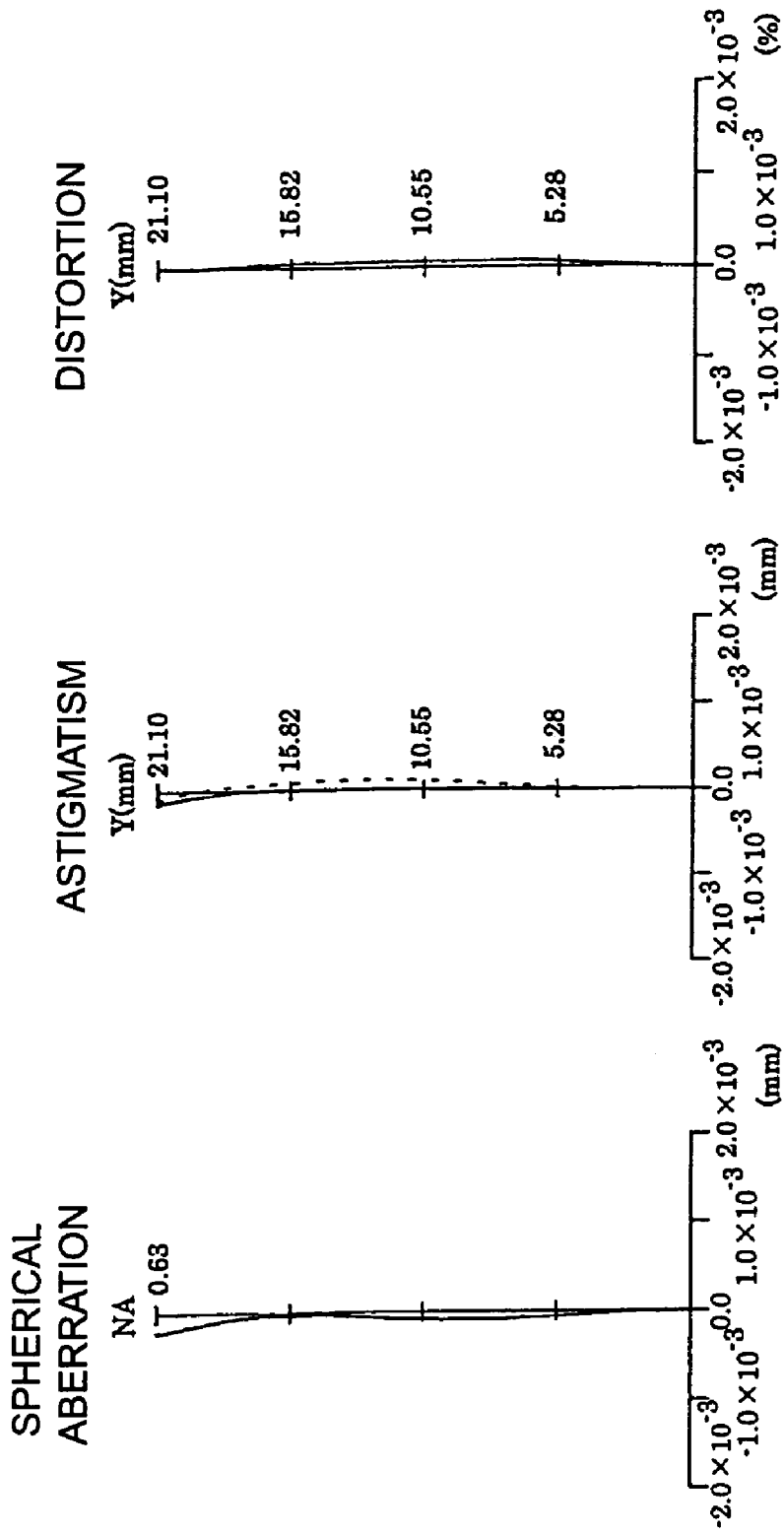
FIGS. 3A–3C are drawings showing spherical aberration, astigmatism, and distortion, respectively, in the first embodiment.
Figure 4:
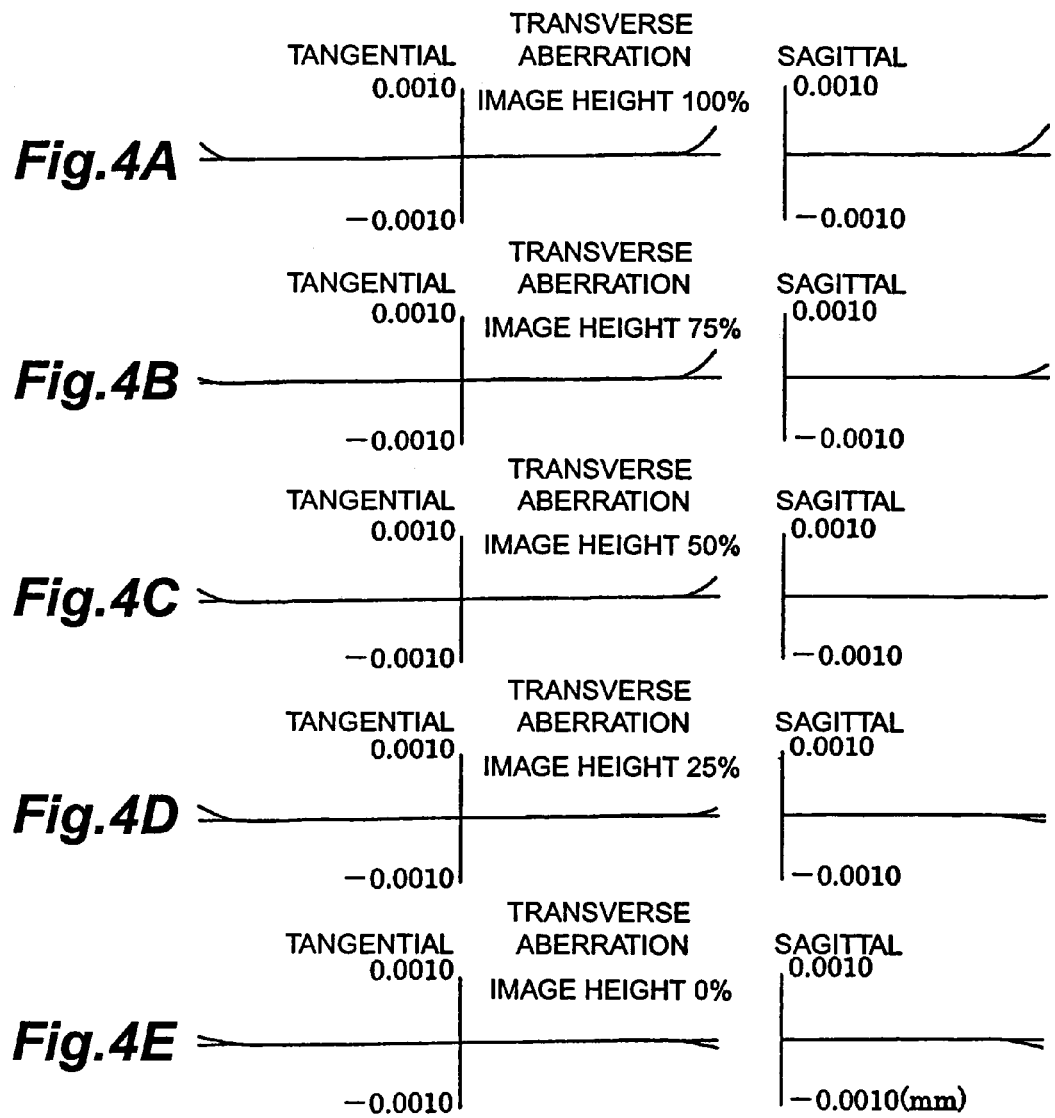

FIGS. 3A–3C are diagrams showing spherical aberration, astigmatism, and distortion, respectively, in the first embodiment. FIGS. 4A–4E are diagrams showing the transverse aberration in the first embodiment. In each of the aberration diagrams, NA represents the image-side numerical aperture, and Y the image height (mm). In the aberration diagram showing astigmatism, a solid line indicates a sagittal image surface, and a dashed line a meridional image surface. The above-stated notation also applies similarly to FIGS. 6A–6C, 7A–7E, 9A–9C, 10A–10E, 12A–12C, 13A–13E, 15A–15C, 16A–16E, and 18A–18E described hereinafter. It is clearly seen from the aberration diagrams that in the first embodiment the various aberrations including distortion are corrected well, while securing the large numerical aperture of NA=0.63 and the large maximum image height (in turn, the large image field) of $Y_0$=21.1 mm.

[Second Embodiment]

Figure 5:
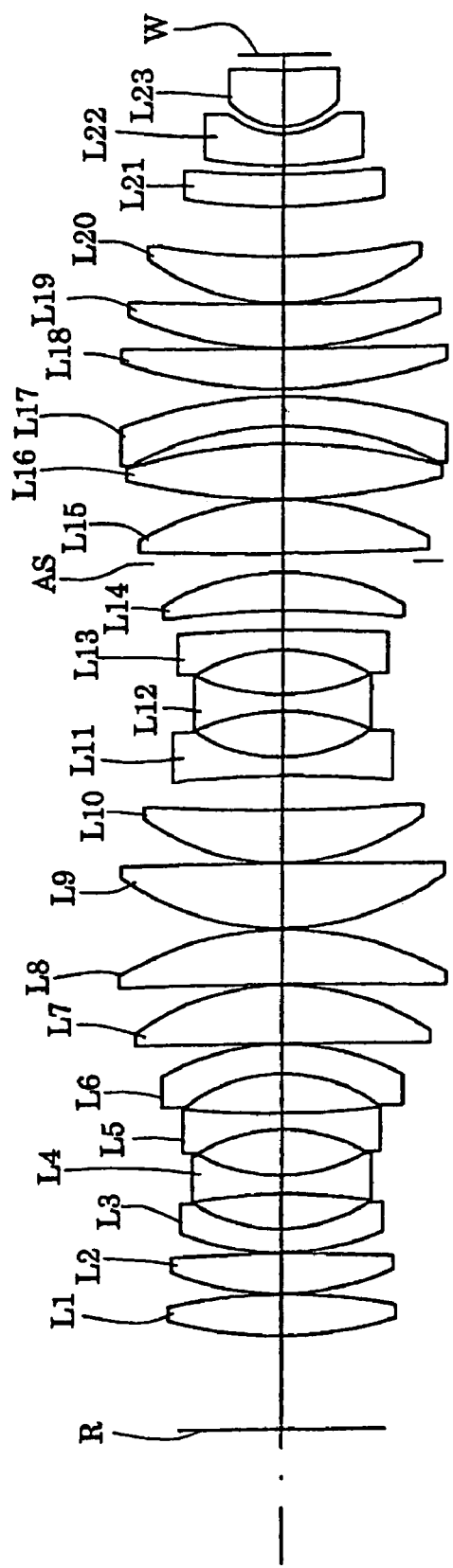
FIG. 5 is a drawing showing a lens setup of the projection optical system according to the second embodiment.
Figure 7A:
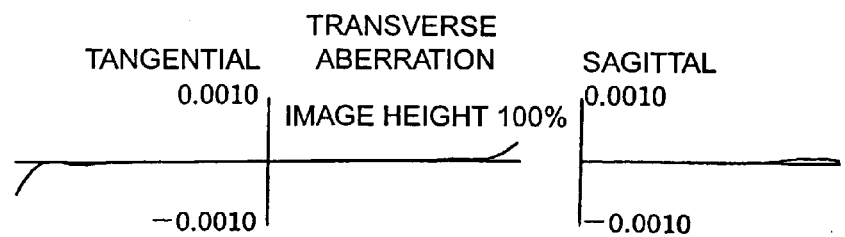
Figure 7B:
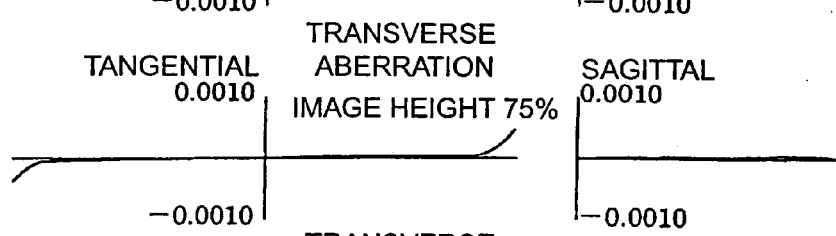
Figure 7C:
Figure 7D:
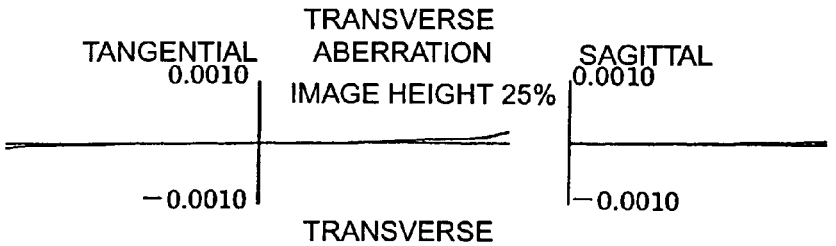
Figure 7E:
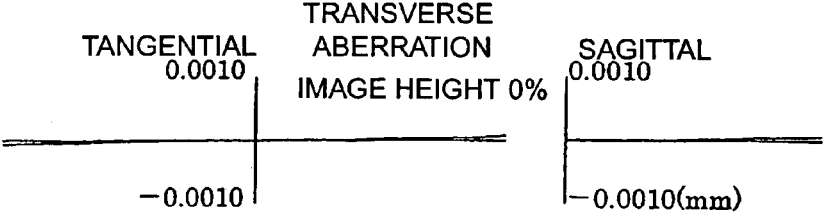

FIG. 5 is a drawing showing the lens setup of the projection optical system according to the second embodiment. With reference to FIG. 5, the projection optical system PL of the second embodiment is comprised of the following lenses named in order from the reticle side: biconvex lens L1, biconvex lens L2, negative meniscus lens L3 with a concave surface of aspherical shape facing the wafer side, biconcave lens L4, biconcave lens L5 with a concave surface of aspherical shape facing the wafer side, negative meniscus lens L6 with a concave surface facing the reticle side, positive meniscus lens L7 with a concave surface facing the reticle side, positive meniscus lens L8 with a concave surface facing the reticle side, biconvex lens L9, positive meniscus lens L10 with a convex surface facing the reticle side, biconcave lens L11 with a concave surface of aspherical shape facing the wafer side, biconcave lens L12 with a concave surface of aspherical shape facing the wafer side, negative meniscus lens L13 with a concave surface facing the reticle side, positive meniscus lens L14 with a concave surface of aspherical shape facing the reticle side, aperture stop A5, biconvex lens L15, biconvex lens L16, negative meniscus lens L17 with a concave surface facing the reticle side, positive meniscus lens L18 with a convex surface facing the reticle side, positive meniscus lens L19 with a convex surface facing the reticle side, positive meniscus lens L20 with a convex surface facing the reticle side, positive meniscus lens L21 with a concave surface of aspherical shape facing the wafer side, negative meniscus lens L22 with a convex surface facing the reticle side, and positive meniscus lens L23 with a convex surface facing the reticle side.

Table (2) below provides a list of values of specifications in the projection optical system according to the second embodiment.

TABLE 2

(Major Specifications)

$\lambda$ = 248.4 nm
$\beta$ = –1/4
NA = 0.65
$Y_0$ = 21.1 mm (Specifications of Optical Members)

| Surface No. | r | d | n | |
|---|---|---|---|---|
| (Reticle surface) | | 85 | | |
| 1 | 370.169 | 36.976 | 1.50839 | (L1) |
| 2 | –539.027 | 1 | | |
| 3 | 260.614 | 35.323 | 1.50839 | (L2) |
| 4 | –1805.66 | 1 | | |
| 5 | 237.342 | 21.572 | 1.50839 | (L3) |
| 6* | 139.323 | 31.377 | | |
| 7 | –516.888 | 17 | 1.50839 | (L4) |
| 8 | 150 | 42.425 | | |
| 9 | –147.29 | 15 | 1.50839 | (L5) |
| 10* | 816.066 | 35.905 | | |
| 11 | –147.082 | 27 | 1.50839 | (L6) |
| 12 | –225.4 | 1 | | |
| 13 | –41392 | 53.976 | 1.50839 | (L7) |
| 14 | –227.618 | 1 | | |
| 15 | –8608.53 | 50.952 | 1.50839 | (L8) |
| 16 | –284.185 | 1 | | |
| 17 | 243.06 | 59.2 | 1.50839 | (L9) |
| 18 | –37613.5 | 1 | | |
| 19 | 203.88 | 49.991 | 1.50839 | (L10) |
| 20 | 1553.442 | 32.55 | | |
| 21 | –1036.81 | 17 | 1.50839 | (L11) |
| 22* | 148.605 | 42.594 | | |
| 23 | –191.614 | 15 | 1.50839 | (L12) |
| 24* | 189.595 | 41.625 | | |
| 25 | –146.676 | 18.454 | 1.50839 | (L13) |
| 26 | –1600.72 | 18.651 | | |
| 27* | –759.531 | 35.576 | 1.50839 | (L14) |
| 28 | –211.058 | 10.001 | | |
| 29 | ∞ | 7.194 | | (AS) |
| 30 | 2974.88 | 48.903 | 1.50839 | (L15) |
| 31 | –260.354 | 1 | | |
| 32 | 533.226 | 51.054 | 1.50839 | (L16) |
| 33 | –497.281 | 16.334 | | |
| 34 | –297.478 | 28 | 1.50839 | (L17) |
| 35 | –410.191 | 6.962 | | |
| 36 | 432.489 | 35.698 | 1.50839 | (L18) |
| 37 | 5542.48 | 1 | | |
| 38 | 339.32 | 38.398 | 1.50839 | (L19) |
| 39 | 2529.767 | 1.073 | | |
| 40 | 205.053 | 40.997 | 1.50839 | (L20) |
| 41 | 570.26 | 44.016 | | |
| 42 | 526.794 | 28.369 | 1.50839 | (L21) |
| 43* | 999.637 | 7.316 | | |
| 44 | 363.9 | 26.929 | 1.50839 | (L22) |
| 45 | 80.011 | 6.368 | | |
| 46 | 68.127 | 47.548 | 1.50839 | (L23) |
| 47 | 333.792 | 13.6933 | | |
| (Wafer surface) | | | | |

(Aspherical Data)

Surface 6

$\kappa = 0$
$C_4 = -2.5830 \times 10^{-8}$   $C_6 = -1.4132 \times 10^{-12}$
$C_8 = -7.1032 \times 10^{-17}$   $C_{10} = 9.7808 \times 10^{-22}$
$C_{12} = -3.4814 \times 10^{-25}$ Surface 10

$\kappa = 0$
$C_4 = -5.2948 \times 10^{-9}$   $C_6 = 1.6031 \times 10^{-12}$
$C_8 = -4.1130 \times 10^{-17}$   $C_{10} = -5.8947 \times 10^{-22}$
$C_{12} = 3.0968 \times 10^{-26}$ Surface 22

$\kappa = 0$
$C_4 = 3.2206 \times 10^{-8}$   $C_6 = 1.8939 \times 10^{-12}$
$C_8 = 9.9966 \times 10^{-17}$   $C_{10} = 2.8187 \times 10^{-21}$
$C_{12} = 4.7609 \times 10^{-25}$ Surface 24

$\kappa = 0$
$C_4 = 3.8141 \times 10^{-6}$   $C_6 = -3.4162 \times 10^{-12}$
$C_8 = 1.2024 \times 10^{-19}$   $C_{10} = 9.9690 \times 10^{-21}$
$C_{12} = -2.2108 \times 10^{-25}$ Surface 27

$\kappa = 0$
$C_4 = 1.2927 \times 10^{-9}$   $C_6 = 1.7523 \times 10^{-18}$
$C_8 = 3.6435 \times 10^{-18}$   $C_{10} = 1.1104 \times 10^{-22}$
$C_{12} = 1.0330 \times 10^{-26}$ -continued Surface 43

$\kappa = 0$
$C_4 = 2.3875 \times 10^{-8}$     $C_6 = 1.3965 \times 10^{-12}$
$C_8 = -4.3074 \times 10^{-17}$   $C_{10} = 3.1012 \times 10^{-21}$
$C_{12} = -1.9832 \times 10^{-26}$ (Values Corresponding to Conditional Expressions)

L=1250.0003 mm

E=2913.034 mm $(\lambda \times L)/(NA \times Y_0^2) = 1.073 \times 10^{-3}$  (1)

$E/L = 2.33$  (2)

FIGS. 6A–6C are diagrams showing spherical aberration, astigmatism, and distortion, respectively, in the second embodiment. FIGS. 7A–7E are diagrams showing the transverse aberration in the second embodiment. It is clearly seen from the aberration diagrams that in the second embodiment the various aberrations including distortion are corrected well, while securing the large numerical aperture of NA=0.65 and the large maximum image height (in turn, the large image field) of $Y_0$=21.1 mm.

[Third Embodiment]

Figure 8:
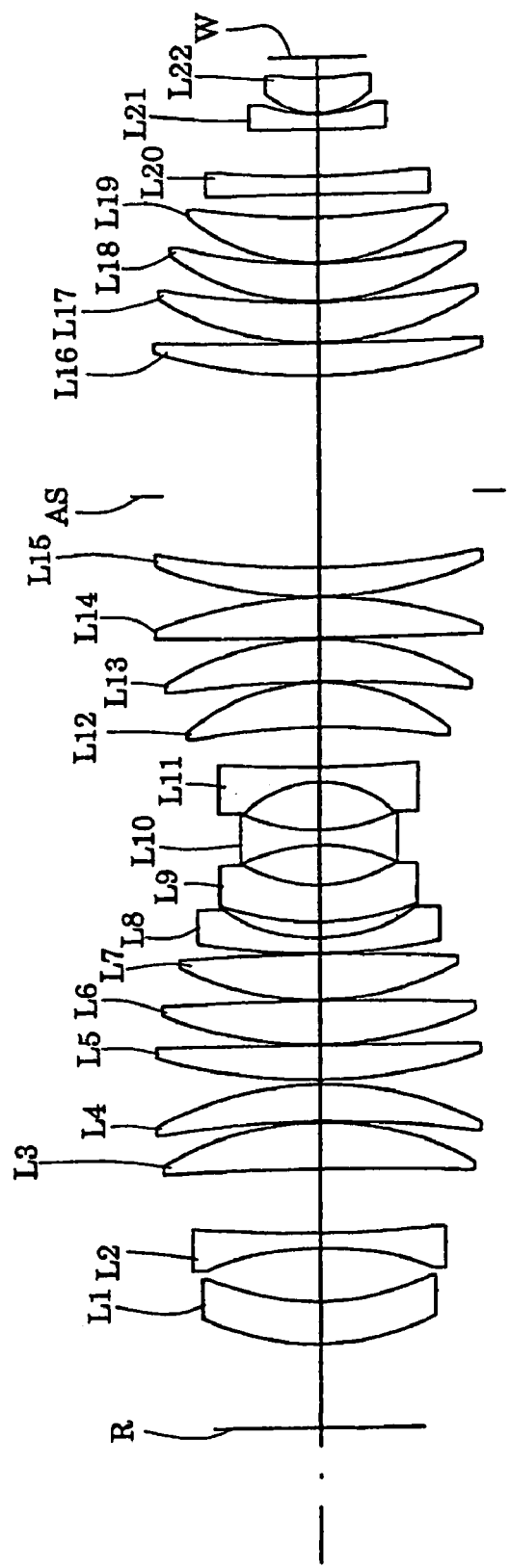
FIG. 8 is a drawing showing a lens setup of the projection optical system according to the third embodiment.

FIG. 8 is a drawing showing the lens setup of the projection optical system according to the third embodiment. With reference to FIG. 8, the projection optical system PL of the third embodiment is comprised of the following lenses named in order from the reticle side: negative meniscus lens L1 with a convex surface facing the reticle side, a biconcave lens L2 with a concave surface of aspherical shape facing the reticle side, positive meniscus lens L3 with a concave surface facing the reticle side, positive meniscus lens L4 with a concave surface facing the reticle side, positive meniscus lens L5 with a convex surface facing the reticle side, biconvex lens L6, biconvex lens L7, negative meniscus lens L8 with a concave surface of aspherical shape facing the wafer side, negative meniscus lens L9 with a concave surface of aspherical shape facing the wafer side, biconcave lens L10 with a concave surface of aspherical shape facing the wafer side, biconcave lens L11, positive meniscus lens L12 with a concave surface facing the reticle side, positive meniscus lens L13 with a concave surface facing the reticle side, biconvex lens L14, positive meniscus lens L15 with a convex surface facing the reticle side, aperture stop A5, positive meniscus lens L16 with a convex surface facing the reticle side, positive meniscus lens L17 with a convex surface facing the reticle side, positive meniscus lens L18 with a convex surface facing the reticle side, positive meniscus lens L19 with a convex surface facing the reticle side, plano-concave lens L20 with a concave surface of aspherical shape facing the wafer side, negative meniscus lens L21 with a concave surface of aspherical shape facing the wafer side, and positive meniscus lens L22 with a convex surface facing the reticle side.

Table (3) below provides a list of values of specifications in the projection optical system according to the third embodiment. In the major specifications of Table (3), $H_0$ represents the maximum object height, and in the specifications of the optical components in Table (3), $\phi$ represents a clear aperture radius (mm), of each surface.

TABLE 3

(Major Specifications)

$\lambda = 248.4$ nm
$\beta = -1/4$
NA = 0.68
$Y_0 = 21.1$ mm
$H_0 = 84.4$ mm (Specifications of Optical Members)

| Surface No. | r | d | n | ø | |
|---|---|---|---|---|---|
| (Reticle surface) | | 75.474 | | | |
| 1 | 231.822 | 38.045 | 1.50839 | 101.52 | (L1) |
| 2* | 199.861 | 47.864 | | 99.455 | |
| 3* | −374.56 | 14 | 1.50839 | 100.413 | (L2) |
| 4 | 1087.945 | 57.682 | | 109.753 | |
| 5 | −3912.28 | 42.876 | 1.50839 | 132.707 | (L3) |
| 6 | −277.623 | 1 | | 135.647 | |
| 7 | −975.662 | 34.107 | 1.50839 | 140.41 | (L4) |
| 8 | −310 | 4.545 | | 142.068 | |
| 9 | 480.296 | 31.573 | 1.50839 | 142.104 | (L5) |
| 10 | 13824.8 | 1 | | 141.047 | |
| 11 | 345.841 | 39.937 | 1.50839 | 136.553 | (L6) |
| 12 | −4264.05 | 1 | | 134.154 | |
| 13 | 256.582 | 42.585 | 1.50839 | 120.583 | (L7) |
| 14 | −2435.28 | 1 | | 116.222 | |
| 15 | 557.373 | 14 | 1.50839 | 104.606 | (L8) |
| 16* | 157.296 | 15.308 | | 85.859 | |
| 17 | 246.555 | 33.989 | 1.50839 | 84.985 | (L9) |
| 18* | 111.492 | 37.164 | | 68.319 | |
| 19 | −155.285 | 14 | 1.50839 | 67.684 | (L10) |
| 20* | 158.037 | 45.453 | | 65.478 | |
| 21 | −90.143 | 14.012 | 1.50839 | 65.86 | (L11) |
| 22 | 1112.61 | 37.578 | | 86.117 | |
| 23 | −641.094 | 41.361 | 1.50839 | 107.984 | (L12) |
| 24 | −178.026 | 1 | | 113.521 | |
| 25 | −1135.28 | 38.98 | 1.50839 | 129.498 | (L13) |
| 26 | −257.706 | 1 | | 132.719 | |
| 27 | 4389.8 | 38.124 | 1.50839 | 141.281 | (L14) |
| 28 | −399.252 | 1 | | 142.508 | |
| 29 | 349.711 | 27.065 | 1.50839 | 142.696 | (L15) |
| 30 | 683.493 | 70.062 | | 141.251 | |
| 31 | ∞ | 107.614 | | 138.646 | (AS) |
| 32 | 441.733 | 30 | 1.50839 | 142.714 | (L16) |
| 33 | 3010.506 | 1 | | 141.924 | |
| 34 | 259.936 | 35.745 | 1.50839 | 138.201 | (L17) |
| 35 | 683.423 | 1 | | 135.649 | |
| 36 | 220.377 | 33.003 | 1.50839 | 127.27 | (L18) |
| 37 | 452.009 | 1 | | 123.157 | |
| 38 | 177.601 | 39.097 | 1.50839 | 111.415 | (L19) |
| 39 | 575.408 | 20.306 | | 105.67 | |
| 40 | ∞ | 16 | 1.50839 | 96.125 | (L20) |
| 41* | 844.277 | 40.65 | | 85.67 | |
| 42 | 1622.9 | 14 | 1.50839 | 58.186 | (L21) |
| 43* | 134.25 | 1 | | 48.308 | |
| 44 | 71.19 | 29.261 | 1.50839 | 44.506 | (L22) |
| 45 | 232.287 | 17.5256 | | 34.911 | |
| (Wafer surface) | | | | | |

(Aspherical Data)

Surface 2

$\kappa = 0$
$C_4 = -4.1502 \times 10^{-8}$    $C_6 = 2.9831 \times 10^{-13}$
$C_8 = 2.2965 \times 10^{-17}$    $C_{10} = -3.3074 \times 10^{-21}$
$C_{12} = 3.0534 \times 10^{-25}$  $C_{14} = -1.5922 \times 10^{-29}$
$C_{16} = 2.5895 \times 10^{-34}$ -continued Surface 3

$\kappa = 0$
$C_4 = -4.1155 \times 10^{-8}$    $C_6 = -4.2875 \times 10^{-13}$
$C_8 = 1.1750 \times 10^{-17}$    $C_{10} = 4.8956 \times 10^{-22}$
$C_{12} = -2.2368 \times 10^{-25}$    $C_{14} = 2.0569 \times 10^{-29}$
$C_{16} = -8.3869 \times 10^{-34}$ Surface 16

$\kappa = 0$
$C_4 = 4.4486 \times 10^{-8}$    $C_6 = -2.9141 \times 10^{-15}$
$C_8 = 1.2928 \times 10^{-16}$    $C_{10} = 5.2310 \times 10^{-21}$
$C_{12} = 2.7283 \times 10^{-25}$    $C_{14} = 5.4172 \times 10^{-29}$
$C_{16} = 5.5839 \times 10^{-34}$ Surface 18

$\kappa = 0$
$C_4 = -1.3891 \times 10^{-7}$    $C_6 = -3.0973 \times 10^{-13}$
$C_8 = -3.9700 \times 10^{-16}$    $C_{10} = -7.9024 \times 10^{-20}$
$C_{12} = 7.8062 \times 10^{-24}$    $C_{14} = -3.0617 \times 10^{-27}$
$C_{16} = 2.0719 \times 10^{-31}$ Surface 20

$\kappa = 0$
$C_4 = 4.8876 \times 10^{-8}$    $C_6 = -6.8085 \times 10^{-12}$
$C_8 = 5.9452 \times 10^{-16}$    $C_{10} = 1.7262 \times 10^{-20}$
$C_{12} = 8.4920 \times 10^{-24}$    $C_{14} = -1.3744 \times 10^{-27}$
$C_{16} = 8.9638 \times 10^{-32}$ Surface 41

$\kappa = 0$
$C_4 = 1.1607 \times 10^{-8}$    $C_6 = 4.3405 \times 10^{-13}$
$C_8 = -8.0755 \times 10^{-17}$    $C_{10} = 6.3294 \times 10^{-21}$
$C_{12} = -3.8914 \times 10^{-25}$    $C_{14} = 2.0077 \times 10^{-29}$
$C_{16} = -5.3721 \times 10^{-34}$ Surface 43

$\kappa = 0$
$C_4 = 3.3236 \times 10^{-8}$    $C_6 = -1.4246 \times 10^{-11}$
$C_8 = -1.2965 \times 10^{-16}$    $C_{10} = -2.1005 \times 10^{-19}$
$C_{12} = 5.6985 \times 10^{-24}$    $C_{14} = 4.4185 \times 10^{-27}$
$C_{16} = -1.6556 \times 10^{-31}$ (Values corresponding to Conditional Expressions)

L = 1249.9856 mm
E = 1644.276 mm
(1) $(\lambda \times L)/(NA \times Y_0^2) = 1.026 \times 10^{-3}$
(2) E/L = 1.32

Figure 9:
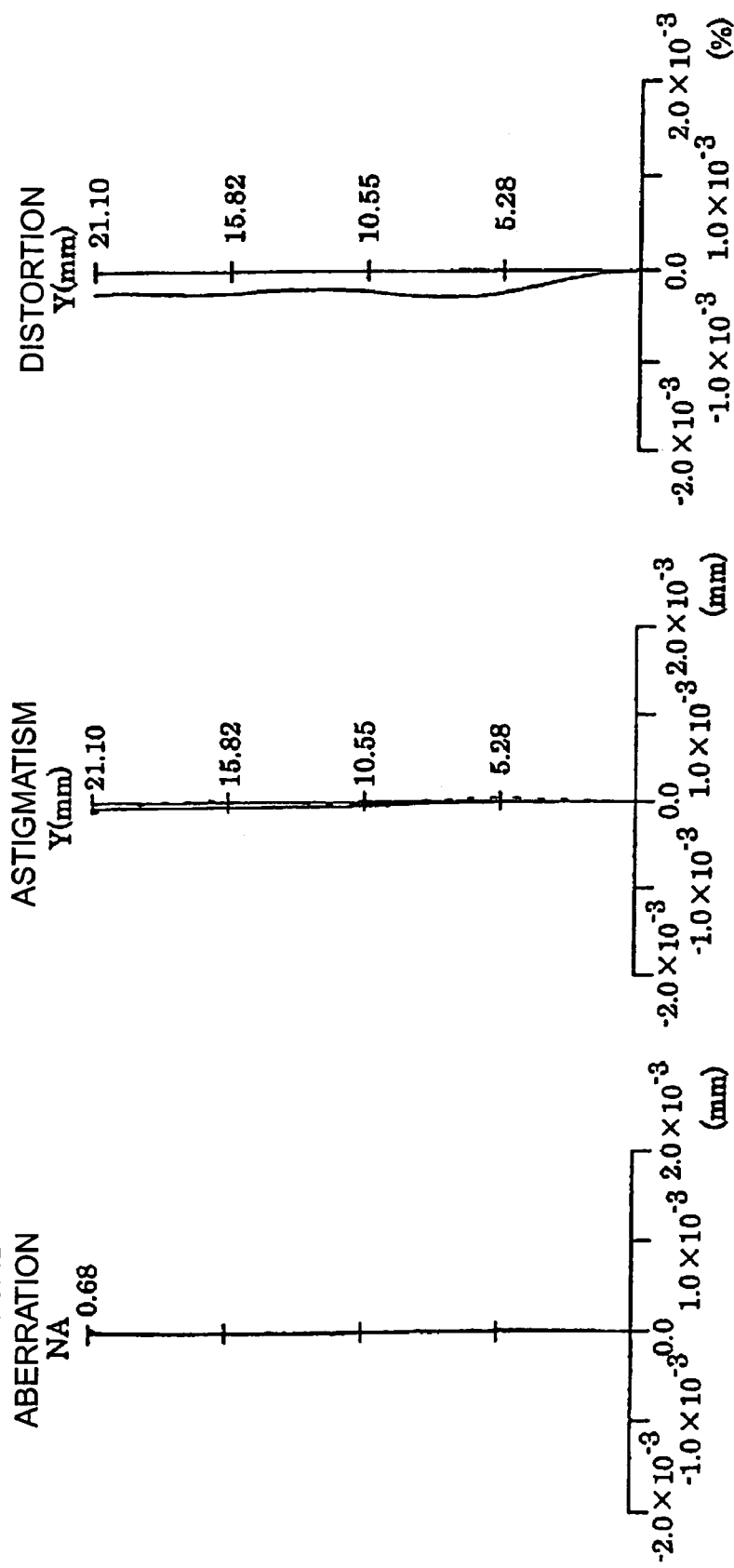
FIGS. 9A–9C are drawings showing spherical aberration, astigmatism, and distortion, respectively, in the third embodiment.
Figure 10:
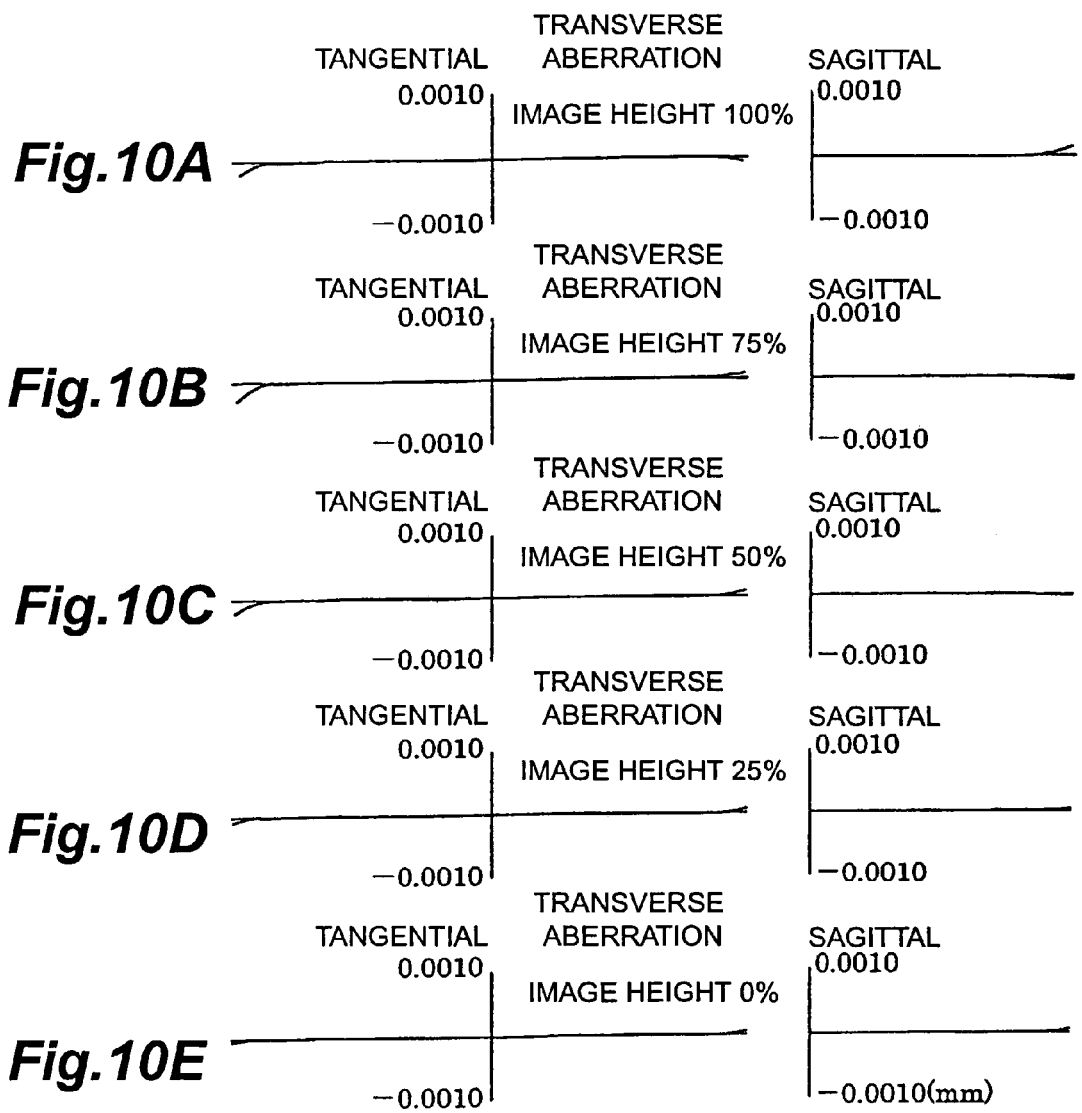

FIGS. 9A–9C are diagrams showing spherical aberration, astigmatism, and distortion, respectively, in the third embodiment. FIGS. 10A–10E are diagrams showing the transverse aberration in the third embodiment. It is clearly seen from the aberration diagrams that in the third embodiment the various aberrations including distortion are corrected well, while securing the large numerical aperture of NA=0.68 and the large maximum image height (in turn, the large image field) of $Y_0$=21.1 mm.

As described above, the projection optical systems PL in the first embodiment to the third embodiment are compact, high-performance optical systems made of the optical material having the refractive index of not more than 1.6, being substantially telecentric both on the object side and on the image side, and satisfying the condition of $(\lambda \times L)/(NA \times Y_0^2)$ <$1.5 \times 10^{-3}$, which are thus well corrected for the various aberrations including distortion, while securing the satisfactorily large numerical aperture and the satisfactorily wide imaging area.

[Fourth Embodiment]

Figure 11:
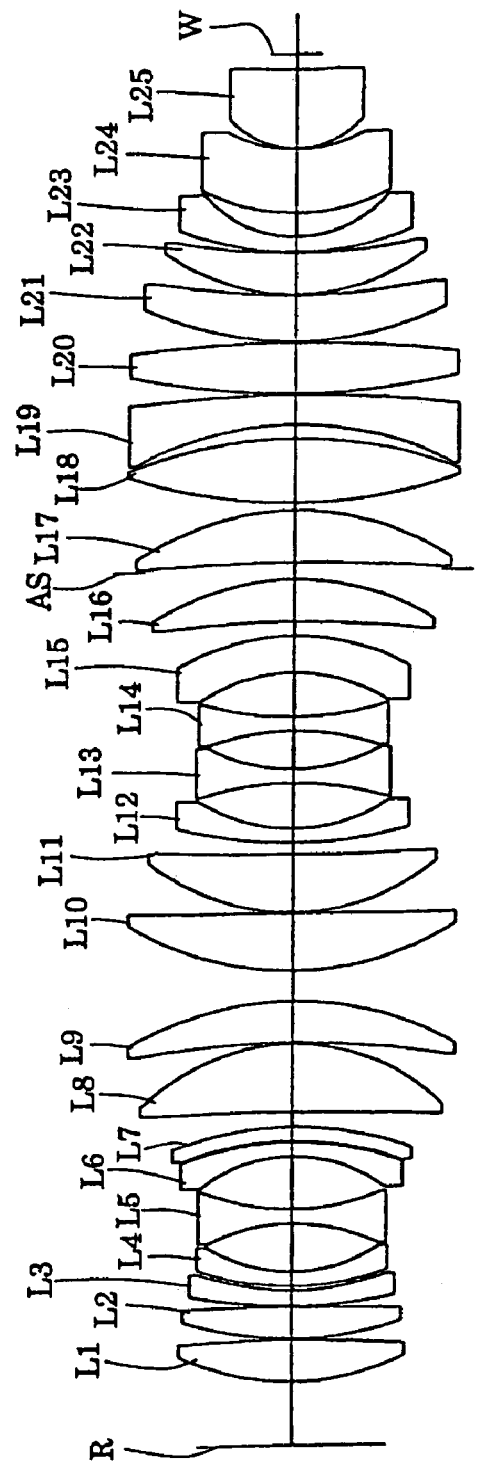
FIG. 11 is a drawing showing a lens setup of the projection optical system according to the fourth embodiment.

FIG. 11 is a drawing showing the lens setup of the projection optical system according to the fourth embodiment. With reference to FIG. 11, the projection optical system PL of the fourth embodiment is comprised of the following lenses named in order from the reticle side: biconvex lens L1, biconvex lens L2, negative meniscus lens L3 with a concave surface of aspherical shape facing the wafer side, negative meniscus lens L4 with a convex surface facing the reticle side, biconcave lens L5, negative meniscus lens L6 with a concave surface facing the reticle side, positive meniscus lens L7 with a concave surface of aspherical shape facing the reticle side, positive meniscus lens LB with a concave surface facing the reticle side, positive meniscus lens L9 with a concave surface facing the reticle side, positive meniscus lens L10 with a convex surface facing the reticle side, positive meniscus lens L11 with a convex surface facing the reticle side, negative meniscus lens L12 with a convex surface facing the reticle side, biconcave lens L13 with a concave surface of aspherical shape facing the reticle side, biconcave lens L14 with a concave surface of aspherical shape facing the reticle side, negative meniscus lens L15 with a concave surface facing the reticle side, positive meniscus lens L16 with a concave surface of aspherical shape facing the reticle side, aperture stop A5, positive meniscus lens L17 with a concave surface facing the reticle side, biconvex lens L18, negative meniscus lens L19 with a concave surface facing the reticle side, biconvex lens L20, positive meniscus lens L21 with a concave surface of aspherical shape facing the wafer side, positive meniscus lens L22 with a concave surface of aspherical shape facing the wafer side, negative meniscus lens L23 with a convex surface facing the reticle side, negative meniscus lens L24 with a convex surface facing the reticle side, and positive meniscus lens L25 with a convex surface facing the reticle side.

In the fourth embodiment all the lenses are made of silica. Table (4) below provides a list of values of specifications in the projection optical system according to the fourth embodiment.

TABLE 4

(Major Specifications)

$\lambda = 193.3$ nm
$\beta = -1/4$
NA = 0.70
$Y_0 = 21.1$ mm (Specifications of Optical Members)

| Surface No. | r | d | n | |
|---|---|---|---|---|
| (Reticle surface) | | 55.977 | | |
| 1 | 236.375 | 36.708 | 1.560326 | (L1) |
| 2 | −1326.86 | 1 | | |
| 3 | 305.858 | 27.807 | 1.560326 | (L2) |
| 4 | −4988.92 | 1 | | |
| 5 | 478.298 | 13 | 1.560326 | (L3) |
| 6* | 216.036 | 3.877 | | |
| 7 | 246.432 | 13 | 1.560326 | (L4) |
| 8 | 142.617 | 42.514 | | |
| 9 | −176.904 | 13 | 1.560326 | (L5) |
| 10 | 212.782 | 47.102 | | |
| 11 | −134.266 | 13 | 1.560326 | (L6) |
| 12 | −276.22 | 1 | | |
| 13* | −312.207 | 13 | 1.560326 | (L7) |
| 14 | −305.626 | 13.453 | | |
| 15 | 3214.32 | 61.536 | 1.560326 | (L8) |
| 16 | −190.911 | 1.316 | | |
| 17 | −837.247 | 37.999 | 1.560326 | (L9) |
| 18 | −291.832 | 27.817 | | |
| 19 | 266.829 | 52.664 | 1.560326 | (L10) |
| 20 | 11121.12 | 1 | | |
| 21 | 200.702 | 52.406 | 1.560326 | (L11) |
| 22 | 2260.973 | 10.96 | | |

-continued

| Surface No. | r | d | n | |
|---|---|---|---|---|
| 23 | 386.778 | 13.004 | 1.560326 | (L12) |
| 24 | 152.011 | 41.781 | | |
| 25* | −300.824 | 13 | 1.560326 | (L13) |
| 26 | 156.593 | 35.07 | | |
| 27* | −262.372 | 13.046 | 1.560326 | (L14) |
| 28 | 282.691 | 39.674 | | |
| 29 | −152.11 | 33.875 | 1.560326 | (L15) |
| 30 | −205.29 | 13 | | |
| 31* | −946.981 | 39.169 | 1.560326 | (L16) |
| 32 | −230.012 | 8 | | |
| 33 | ∞ | 8.067 | | (AS) |
| 34 | −1744.14 | 47.891 | 1.560326 | (L17) |
| 35 | −245.859 | 6.842 | | |
| 36 | 445.398 | 57.58 | 1.560326 | (L18) |
| 37 | −411.974 | 13 | | |
| 38 | −300 | 27 | 1.560326 | (L19) |
| 39 | −1310.39 | 1.038 | | |
| 40 | 629.495 | 46.394 | 1.560326 | (L20) |
| 41 | −1301.22 | 1.133 | | |
| 42 | 300 | 41.497 | 1.560326 | (L21) |
| 43* | 572.761 | 1.032 | | |
| 44 | 197.744 | 36.45 | 1.560326 | (L22) |
| 45* | 546.586 | 1 | | |
| 46 | 283.437 | 13 | 1.560326 | (L23) |
| 47 | 108.534 | 20.411 | | |
| 48 | 177.134 | 55.444 | 1.560326 | (L24) |
| 49 | 123.882 | 1 | | |
| 50 | 78.959 | 67.373 | 1.560326 | (L25) |
| 51 | 482.436 | 13.094 | | |
| (Wafer surface) | | | | |

(Aspherical Data)

Surface 6

$\kappa = 0$
$C_4 = -0.390730 \times 10^{-7}$       $C_6 = 0.277980 \times 10^{-13}$
$C_8 = 0.448296 \times 10^{-17}$       $C_{10} = 0.142951 \times 10^{-20}$
$C_{12} = -0.200639 \times 10^{-24}$ Surface 13

$\kappa = 0$
$C_4 = -0.234706 \times 10^{-7}$       $C_6 = -0.309208 \times 10^{-12}$
$C_8 = -0.917319 \times 10^{-17}$      $C_{10} = -0.195900 \times 10^{-21}$
$C_{12} = -0.149005 \times 10^{-25}$ Surface 25

$\kappa = 0$
$C_4 = -0.436112 \times 10^{-7}$       $C_6 = 0.388626 \times 10^{-11}$
$C_8 = -0.127775 \times 10^{-15}$      $C_{10} = 0.347307 \times 10^{-20}$
$C_{12} = -0.812555 \times 10^{-25}$ Surface 27

$\kappa = 0$
$C_4 = -0.359877 \times 10^{-7}$       $C_6 = -0.413098 \times 10^{-11}$
$C_8 = 0.274168 \times 10^{-16}$       $C_{10} = -0.544566 \times 10^{-20}$
$C_{12} = -0.351659 \times 10^{-24}$ Surface 31

$\kappa = 0$
$C_4 = -0.781880 \times 10^{-8}$       $C_6 = 0.625582 \times 10^{-12}$
$C_8 = -0.767116 \times 10^{-17}$      $C_{10} = 0.242844 \times 10^{-21}$
$C_{12} = -0.585103 \times 10^{-26}$ Surface 43

$\kappa = 0$
$C_4 = -0.480511 \times 10^{-8}$       $C_6 = -0.424626 \times 10^{-14}$
$C_8 = -0.773379 \times 10^{-17}$      $C_{10} = -0.156710 \times 10^{-21}$
$C_{12} = 0.781612 \times 10^{-26}$ Surface 45

$\kappa = 0$

-continued $C_4 = -0.126619 \times 10^{-7}$       $C_8 = 0.111075 \times 10^{-11}$
$C_8 = -0.315462 \times 10^{-17}$      $C_{10} = -0.234952 \times 10^{-21}$
$C_{12} = 0.165000 \times 10^{-25}$ (Values Corresponding to Conditional Expression)

L=1250.00 mm $$(\lambda \times L)/(NA \times Y_0^2) = 0.775 \times 10^{-3} \qquad (3)$$

Figure 12:
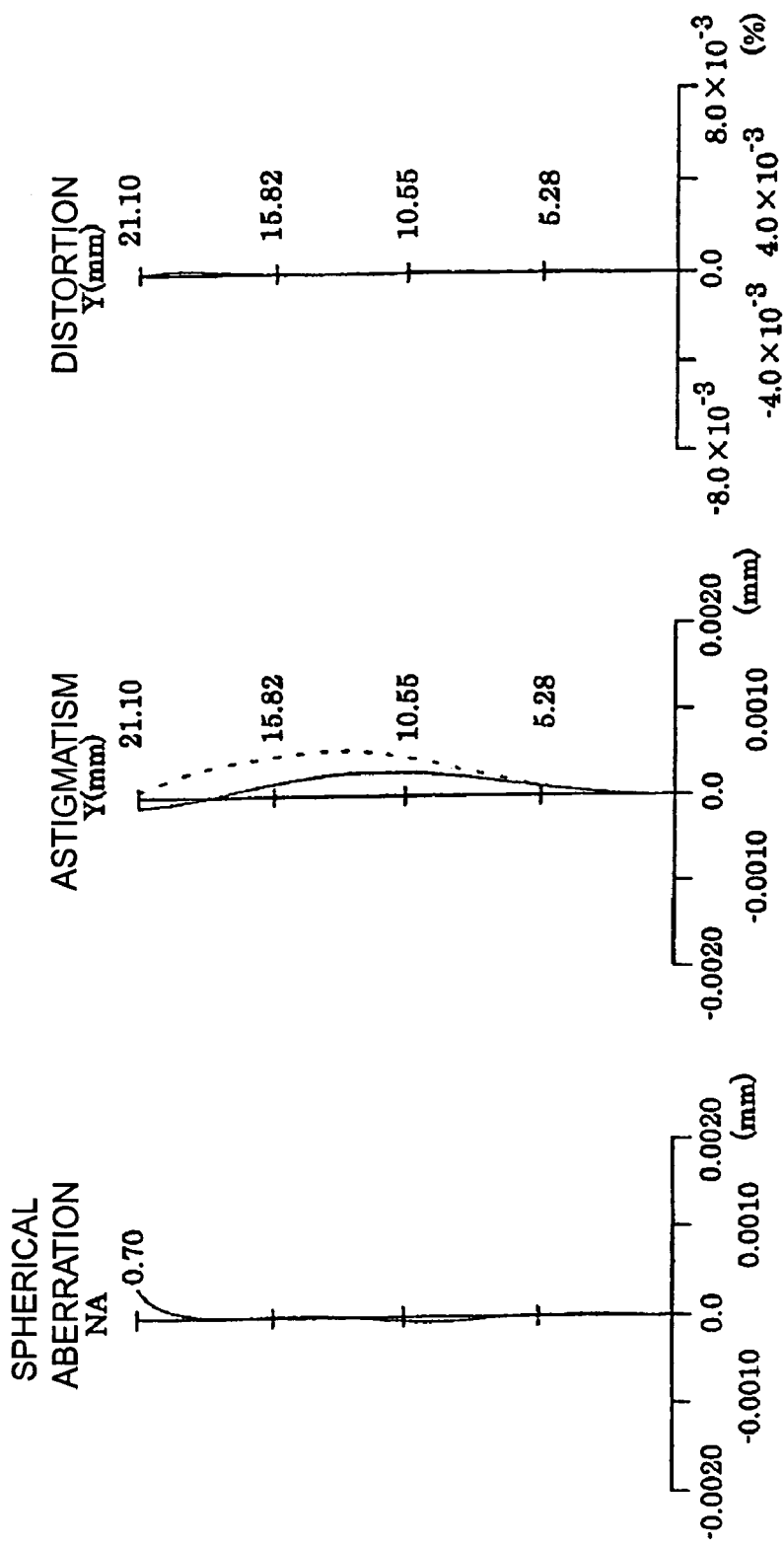
FIGS. 12A–12C are drawings showing spherical aberration, astigmatism, and distortion, respectively, in the fourth embodiment.
Figure 13:
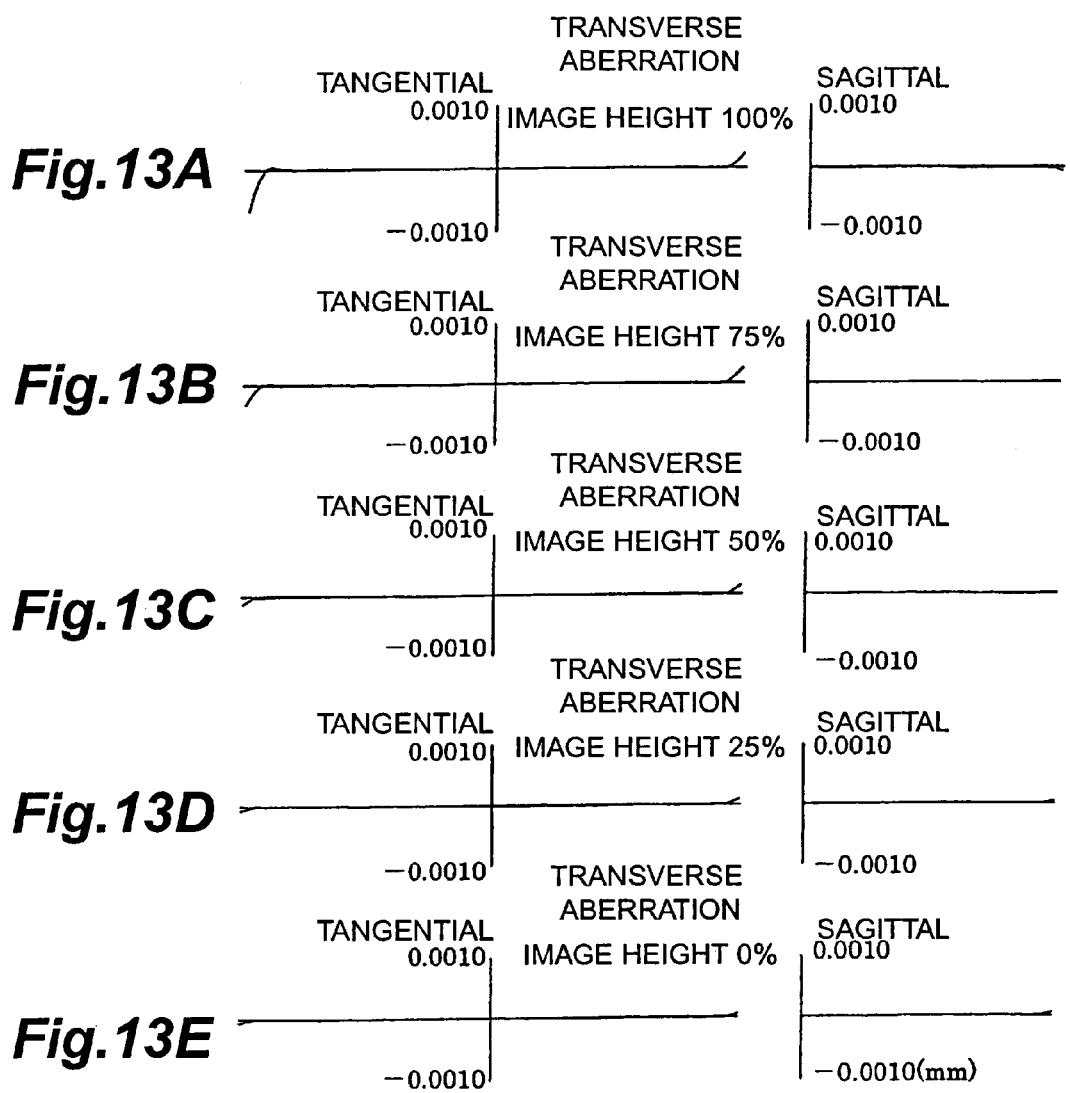

FIGS. 12A–12C are diagrams showing spherical aberration, astigmatism, and distortion, respectively, in the fourth embodiment. FIGS. 13A–13E are diagrams showing the transverse aberration in the fourth embodiment. It is clearly seen from the aberration diagrams that in the fourth embodiment the various aberrations including distortion are corrected well, while securing the large numerical aperture of NA=0.70 and the large maximum image height (in turn, the large image field) of $Y_0$=21.1 mm.

[Fifth Embodiment]

Figure 14:
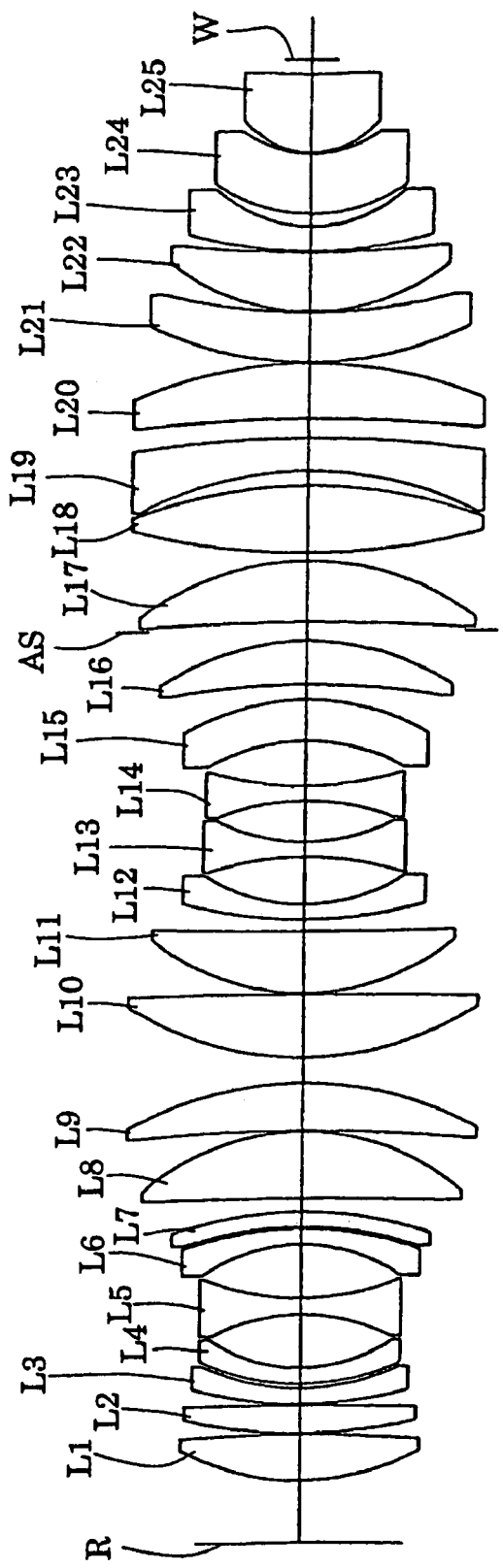
FIG. 14 is a drawing showing a lens setup of the projection optical system according to the fifth embodiment.

FIG. 14 is a diagram showing the lens setup of the projection optical system according to the fifth embodiment. With reference to FIG. 14, the projection optical system PL of the fifth embodiment is comprised of the following lenses named in order from the reticle side: biconvex lens L1, biconvex lens L2, negative meniscus lens L3 with a concave surface of aspherical shape facing the wafer side, negative meniscus lens L4 with a convex surface facing the reticle side, biconcave lens L5, negative meniscus lens L6 with a concave surface facing the reticle side, negative meniscus lens L7 with a concave surface of aspherical shape facing the reticle side, positive meniscus lens L8 with a concave surface facing the reticle side, positive meniscus lens L9 with a concave surface facing the reticle side, biconvex lens L10, positive meniscus lens L11 with a convex surface facing the reticle side, negative meniscus lens L12 with a convex surface facing the reticle side, biconcave lens L13 with a concave surface of aspherical shape facing the reticle side, biconvex lens L14 with a concave surface of aspherical shape facing the reticle side, negative meniscus lens L15 with a concave surface facing the reticle side, positive meniscus lens L16 with a concave surface of aspherical shape facing the reticle side, aperture stop AS, positive meniscus lens L17 with a concave surface facing the reticle side, biconvex lens L18, negative meniscus lens L19 with a concave surface facing the reticle side, positive meniscus lens L20 with a concave surface facing the reticle side, positive meniscus lens L21 with a concave surface of aspherical shape facing the wafer side, positive meniscus lens L22 with a concave surface of aspherical shape facing the wafer side, negative meniscus lens L23 with a convex surface facing the reticle side, negative meniscus lens L24 with a convex surface facing the reticle side, and positive meniscus lens L25 with a convex surface facing the reticle side.

In the fifth embodiment, the lenses L11, L16, L24, and L25 are made of fluorite, and the other lenses of quarts. Table (5) below provides a list of values of specifications in the projection optical system according to the fifth embodiment.

TABLE 5

(Major Specifications)

$\lambda$ = 193.3 nm
$\beta$ = −1/4

TABLE 5-continued (Major Specifications)

NA = 0.70
$Y_0$ = 21.1 mm (Specifications of Optical Members)

| Surface No. | r | d | n | |
|---|---|---|---|---|
| (Reticle surface) | | 51 | | |
| 1 | 213.222 | 38.539 | 1.560326 | (L1) |
| 2 | −1490.37 | 1 | | |
| 3 | 438.51 | 22.96 | 1.560326 | (L2) |
| 4 | −5521.85 | 1 | | |
| 5 | 333.571 | 13 | 1.560328 | (L3) |
| 6* | 177.45 | 4.161 | | |
| 7 | 199.366 | 13.275 | 1.560326 | (L4) |
| 8 | 138.57 | 44.632 | | |
| 9 | −161.84 | 13 | 1.560326 | (L5) |
| 10 | 223.766 | 44.902 | | |
| 11 | −143.814 | 13 | 1.560326 | (L6) |
| 12 | −298.377 | 1.704 | | |
| 13* | −334.582 | 13 | 1.560326 | (L7) |
| 14 | −334.916 | 11.743 | | |
| 15 | −4047.28 | 57.701 | 1.560328 | (L8) |
| 16 | −201.085 | 1 | | |
| 17 | −1435.55 | 40.566 | 1.560326 | (L9) |
| 18 | −302.6 | 21.438 | | |
| 19 | 262.122 | 54.652 | 1.560326 | (L10) |
| 20 | −11336.6 | 1 | | |
| 21 | 196.075 | 53.198 | 1.501455 | (L11) |
| 22 | 3379.244 | 10.47 | | |
| 23 | 369.741 | 13 | 1.560326 | (L12) |
| 24 | 153.333 | 40.357 | | |
| 25* | −303.585 | 13 | 1.560326 | (L13) |
| 26 | 159.474 | 35.089 | | |
| 27* | −234.626 | 13 | 1.560326 | (L14) |
| 28 | 270.159 | 38.992 | | |
| 29 | −165.469 | 35.787 | 1.560326 | (L15) |
| 30 | −196.726 | 13 | | |
| 31* | −735.265 | 37.631 | 1.501455 | (L16) |
| 32 | −216.484 | 8 | | |
| 33 | ∞ | 8 | | (AS) |
| 34 | −2040.79 | 53.321 | 1.560326 | (L17) |
| 35 | −225.458 | 6.842 | | |
| 36 | 552.343 | 57.58 | 1.560326 | (L18) |
| 37 | 414.088 | 13 | | |
| 38 | −300 | 27 | 1.560326 | (L19) |
| 39 | −1036.55 | 16.153 | | |
| 40 | −1325.08 | 46.394 | 1.560326 | (L20) |
| 41 | −376.256 | 1 | | |
| 42 | 300 | 41.497 | 1.560326 | (L21) |
| 43* | 454.03 | 1 | | |
| 44 | 185.557 | 48.502 | 1.560326 | (L22) |
| 45* | 970.728 | 1.204 | | |
| 46 | 374.033 | 20.165 | 1.560326 | (L23) |
| 47 | 120.058 | 9.825 | | |
| 48 | 144.788 | 48.299 | 1.501455 | (L24) |
| 49 | 100.193 | 1 | | |
| 50 | 74.978 | 63 | 1.501455 | (L25) |
| 51 | 412.784 | 11.422 | | |
| (Wafer surface) | | | | |

(Aspherical Data)

Surface 6

$\kappa = 0$
$C_4 = -0.340666 \times 10^{-7}$   $C_6 = -0.320328 \times 10^{-13}$
$C_8 = -0.886363 \times 10^{-17}$   $C_{10} = 0.377243 \times 10^{-20}$
$C_{12} = -0.403299 \times 10^{-24}$ Surface 13

$\kappa = 0$
$C_4 = -0.115164 \times 10^{-7}$   $C_6 = -0.129368 \times 10^{-12}$
$C_8 = 0.153108 \times 10^{-17}$   $C_{10} = -0.400820 \times 10^{-22}$
$C_{12} = 0.893904 \times 10^{-26}$ Surface 25

$\kappa = 0$
$C_4 = -0.610648 \times 10^{-7}$   $C_6 = 0.525010 \times 10^{-11}$
$C_8 = -0.504609 \times 10^{-16}$   $C_{10} = -0.696687 \times 10^{-20}$
$C_{12} = 0.272899 \times 10^{-24}$ Surface 27

$\kappa = 0$
$C_4 = -0.558894 \times 10^{-7}$   $C_6 = -0.492800 \times 10^{-11}$
$C_8 = -0.480602 \times 10^{-16}$   $C_{10} = -0.623444 \times 10^{-20}$
$C_{12} = -0.711183 \times 10^{-24}$ Surface 31

$\kappa = 0$
$C_4 = -0.119246 \times 10^{-7}$   $C_6 = 0.435184 \times 10^{-12}$
$C_8 = -0.397771 \times 10^{-17}$   $C_{10} = 0.205602 \times 10^{-21}$
$C_{12} = -0.942057 \times 10^{-27}$ Surface 43

$\kappa = 0$
$C_4 = -0.105535 \times 10^{-8}$   $C_6 = -0.924566 \times 10^{-13}$
$C_8 = -0.240759 \times 10^{-17}$   $C_{10} = -0.153687 \times 10^{-21}$
$C_{12} = 0.590155 \times 10^{-26}$ Surface 45

$\kappa = 0$
$C_4 = -0.108578 \times 10^{-7}$   $C_6 = 0.130055 \times 10^{-11}$
$C_8 = -0.312792 \times 10^{-16}$   $C_{10} = 0.526315 \times 10^{-21}$
$C_{12} = -0.463864 \times 10^{-26}$ (Values Corresponding to Conditional Expression)

L = 1250.00 mm $$(\lambda \times L)/(NA \times Y_0^2) = 0.775 \times 10^{-3} \quad (3)$$

Figure 15:
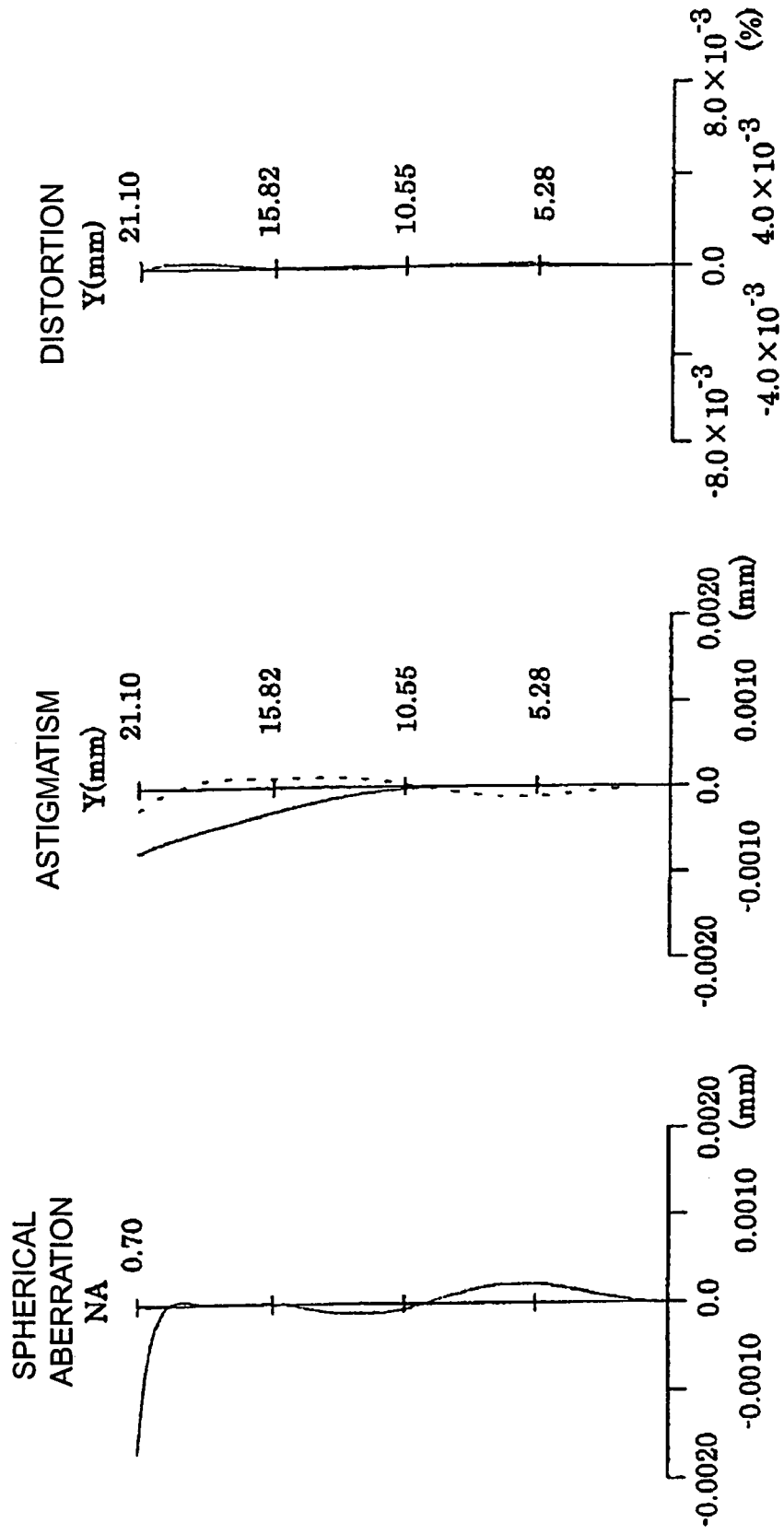
FIGS. 15A–15C are drawings showing spherical aberration, astigmatism, and distortion, respectively, in the fifth embodiment.
Figure 16:
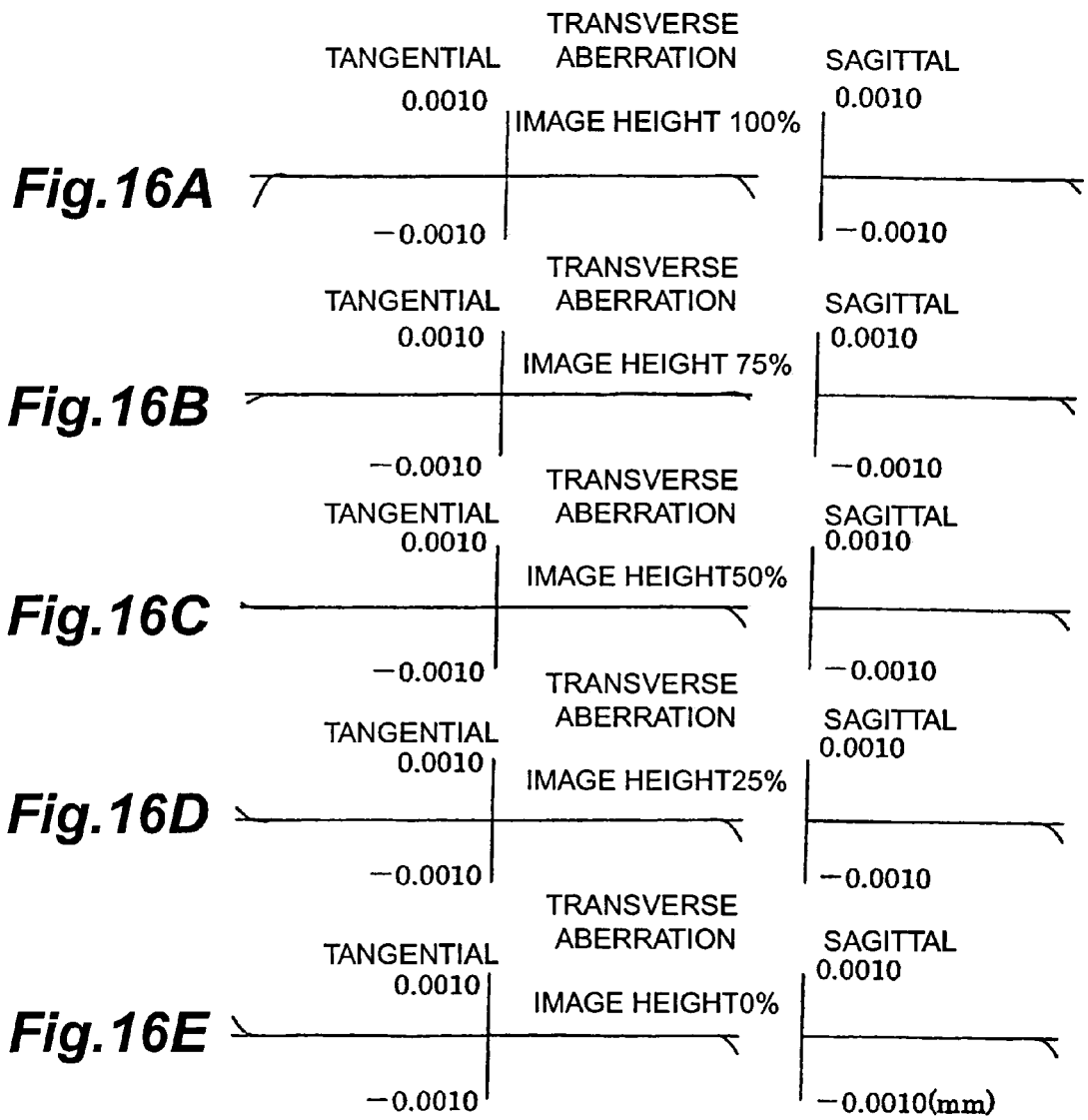

FIGS. 15A–15C are diagrams showing spherical aberration, astigmatism, and distortion, respectively, in the fifth embodiment. FIGS. 16A–16E are diagrams showing the transverse aberration in the fifth embodiment. It is clearly seen from the aberration diagrams that in the fifth embodiment the various aberrations including distortion are corrected well, while securing the large numerical aperture of NA=0.70 and the large maximum image height (in turn, the large image field) of $Y_0$=21.1 mm.

As described above, the projection optical systems PL in the fourth embodiment and the fifth embodiment are made of the optical materials having the refractive index of not more than 1.6 and are substantially telecentric both on the object side and on the image side, seven optical surfaces are formed in the aspherical shape, and the projection optical systems satisfy the conditions below:

$$(\lambda \times L)/(NA \times Y_0^2) < 1.0 \times 10^{-3} \quad (3), \text{ and}$$

$$\lambda < 200 \text{ nm} \quad (4).$$

In the fourth embodiment and the fifth embodiment, the projection optical system satisfies the conditional expression (3), whereby the compact optical system can be obtained while securing the high resolving power and wide field (or securing the satisfactorily large numerical aperture and satisfactorily wide imaging area) and whereby a high throughput can be achieved in application to the exposure apparatus. Specifically, if the left side exceeds the upper limit in the conditional expression (3), a satisfactorily favorable configuration cannot be attained in terms of at least one of the resolving power, the imaging area (exposure area), and the size of the optical system. In order to achieve the better beneficial effect of the present invention, the upper limit in the conditional expression (3) is preferably set to $0.9 \times 10^{-3}$. When the optical system satisfies the conditional expression (4), improvement can be made in the resolving power of the projection optical system PL.

[Sixth Embodiment]

Figure 17:
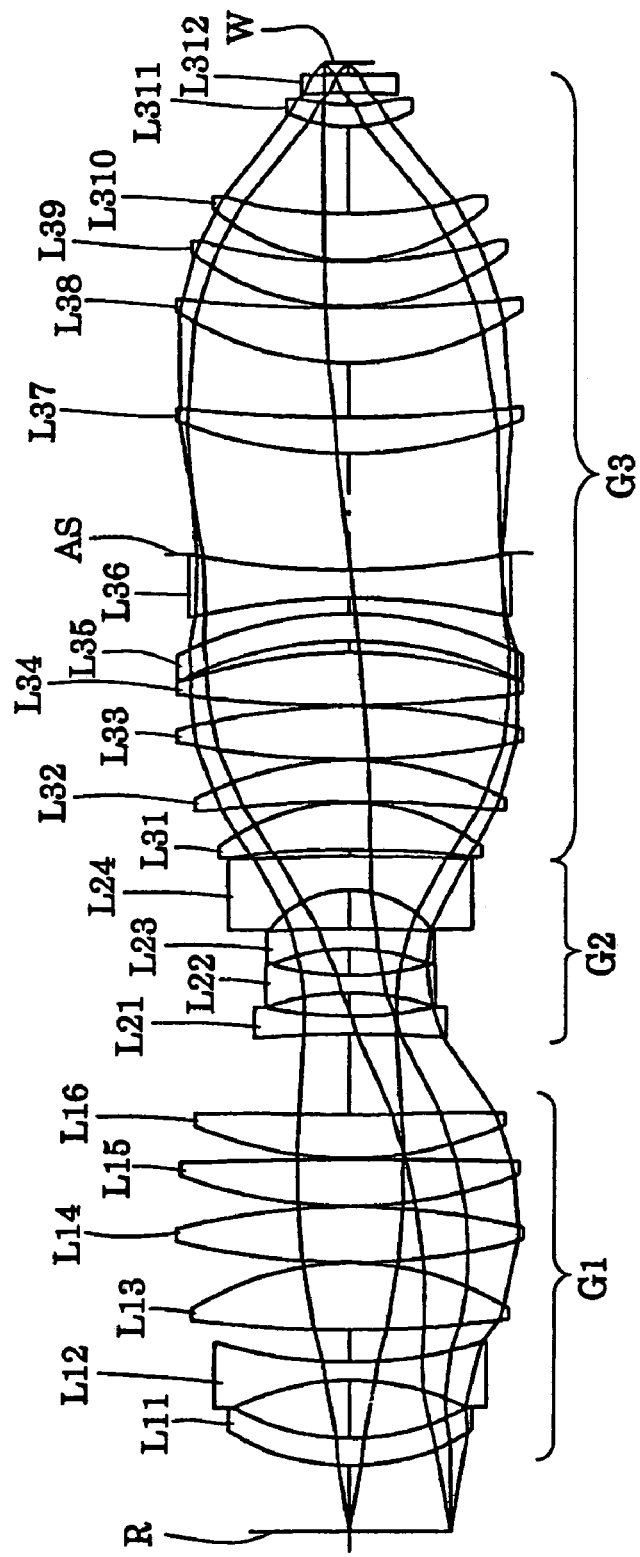
FIG. 17 is a drawing showing a lens setup of the projection optical system according to the sixth embodiment.

FIG. 17 is a diagram showing the lens setup of the projection optical system according to the sixth embodiment. With reference to FIG. 17, the projection optical system PL of the sixth embodiment is comprised of a first lens unit G1 having a positive refracting power, a second lens unit G2 having a negative refracting power, and a third lens unit G3 having a positive refracting power, which are named in order from the reticle side. The first lens unit G1 is comprised of the following lenses named in order from the reticle side: positive meniscus lens L11 with a convex surface of aspherical shape facing the reticle side, biconcave lens L12, biconvex lens L13, biconvex lens L14, biconvex lens L15, and positive meniscus lens L16 with a concave surface of aspherical shape facing the wafer side.

The second lens unit G2 is comprised of the following lenses named in order from the reticle side: biconcave lens L21, biconcave lens L22 with a concave surface of aspherical shape facing the reticle side, negative meniscus lens L23 with a concave surface facing the reticle side, and negative meniscus lens L24 with a concave surface facing the reticle side. The third lens unit G3 is comprised of the following lenses named in order from the reticle side: positive meniscus lens L31 with a concave surface of aspherical shape facing the reticle side, positive meniscus lens L32 with a concave surface facing the reticle side, biconvex lens L33, biconvex lens L34, positive meniscus lens L35 with a concave surface of aspherical shape facing the reticle side, biconcave lens L36, aperture stop AS, positive meniscus lens L37 with a convex surface facing the reticle side, positive meniscus lens L38 with a convex surface facing the reticle side, positive meniscus lens L39 with a convex surface facing the reticle side, positive meniscus lens L310 with a concave surface of aspherical shape facing the wafer side, positive meniscus lens L311 with a concave surface of aspherical shape facing the wafer side, and negative meniscus lens L312 with a concave surface facing the reticle side.

In the sixth embodiment, all the lenses are made of fluorite. Table (6) below provides a list of values of specifications in the projection optical system according to the sixth embodiment. In the major specifications of Table (6), $H_0$ represents the maximum object height and in the specifications of the optical components in Table (6), $\phi$ represents a clear aperture radius (mm) of each surface.

TABLE 6

(Major Specifications)

$\lambda = 157.6$ nm
$\beta = -1/4$
NA = 0.7
$Y_0 = 21.1$ mm
$H_0 = 84.4$ mm ($1.1 \times H_0 = 92.84$ mm)

(Specifications of Optical Members)

| Surface No. | r | d | n | ø | |
|---|---|---|---|---|---|
| (Reticle surface) | | 55.2615 | | | |
| 1* | 203.0634 | 22.9288 | 1.559307 | 99.54 | (L11) |
| 2 | 199.9239 | 49.3188 | | 97.11 | |
| 3 | −215.732 | 15 | 1.559307 | 97.23 | (L12) |
| 4 | 371.7575 | 27.3186 | | 111.12 | |
| 5 | 912.6283 | 57.3547 | 1.559307 | 125.57 | (L13) |
| 6 | −247.809 | 1 | | 129.74 | |
| 7 | 558.9117 | 46.7777 | 1.559307 | 141.57 | (L14) |
| 8 | −617.466 | 1 | | 142 | |
| 9 | 381.3538 | 40.1313 | 1.559307 | 138.61 | (L15) |
| 10 | −4542.91 | 1 | | 136.37 | |
| 11 | 309.0622 | 37.6538 | 1.559307 | 126.73 | (L16) |
| 12* | 1204.428 | 69.8932 | | 122.36 | |
| 13 | −1083.21 | 15 | 1.559307 | 78.6 | (L21) |
| 14 | 319.4939 | 20.2882 | | 69.77 | |
| 15* | −212.922 | 15 | 1.559307 | 69.35 | (L22) |
| 16 | 235.9633 | 22.7588 | | 65.05 | |
| 17 | −173.875 | 17.2332 | 1.559307 | 65.02 | (L23) |
| 18 | −1383.31 | 33.4159 | | 68.51 | |
| 19 | −86.1837 | 29.529 | 1.559307 | 68.68 | (L24) |
| 20 | −2785.75 | 5.6339 | | 99.77 | |
| 21* | −1834.53 | 41.1324 | 1.559307 | 100.69 | (L31) |
| 22 | −181.377 | 1 | | 107.86 | |
| 23 | −983.093 | 35.5918 | 1.559307 | 122.98 | (L32) |
| 24 | −274.754 | 1 | | 127.38 | |
| 25 | 675.8655 | 45.6297 | 1.559307 | 140.85 | (L33) |
| 26 | −545.95 | 1 | | 142 | |
| 27 | 1037.084 | 45.9523 | 1.559307 | 142 | (L34) |
| 28 | −425.488 | 10.1195 | | 141.41 | |
| 29* | −344.487 | 24 | 1.559307 | 141.11 | (L35) |
| 30 | −309.345 | 13.2895 | | 141.6 | |
| 31 | −571.263 | 24.106 | 1.559307 | 132.46 | (L36) |
| 32 | 642.3624 | 14.0052 | | 128.37 | |
| 33 | ∞ | 85.5617 | | 128.44 | (AS) |
| 34 | 382.7332 | 30.9825 | 1.559307 | 142 | (L37) |
| 35 | 1205.531 | 45.9745 | | 141.54 | |
| 36 | 264.7526 | 45.6332 | 1.559307 | 142 | (L38) |
| 37 | 1271.125 | 1.8488 | | 139.42 | |
| 38 | 221.5366 | 36.3877 | 1.559307 | 129.51 | (L39) |
| 39 | 453.4555 | 1.6413 | | 124.45 | |
| 40 | 176.9154 | 38.1695 | 1.559307 | 112.16 | (L310) |
| 41* | 534.2537 | 71.1243 | | 104.85 | |
| 42 | 132.3848 | 17.7337 | 1.559307 | 50.93 | (L311) |
| 43* | 185.7697 | 9.6193 | | 43.19 | |
| 44 | −597.776 | 15 | 1.559307 | 38.95 | (L312) |
| 45 | −3757.74 | 10 | | 30.99 | |
| (Wafer surface) | | | | | |

(Asphereical Data)

Surface 1

$\kappa = 0$
$C_4 = 2.71565 \times 10^{-8}$    $C_6 = -7.39567 \times 10^{-13}$
$C_8 = 2.31594 \times 10^{-17}$   $C_{10} = 4.45225 \times 10^{-22}$
$C_{12} = -7.18557 \times 10^{-26}$  $C_{14} = 3.76048 \times 10^{-30}$ Surface 12

$\kappa = 0$
$C_4 = -2.34467 \times 10^{-8}$   $C_6 = -3.72976 \times 10^{-14}$
$C_8 = 1.30251 \times 10^{-17}$   $C_{10} = 2.97746 \times 10^{-22}$
$C_{12} = -2.33469 \times 10^{-26}$  $C_{14} = 3.52366 \times 10^{-31}$ Surface 15

$\kappa = 0$
$C_4 = -2.26925 \times 10^{-8}$   $C_8 = 2.75024 \times 10^{-12}$
$C_8 = 3.94054 \times 10^{-16}$   $C_{10} = 2.49115 \times 10^{-20}$
$C_{12} = -2.78491 \times 10^{-24}$  $C_{14} = 2.20171 \times 10^{-28}$ Surface 21

$\kappa = 0$
$C_4 = -3.82569 \times 10^{-8}$   $C_6 = 7.26765 \times 10^{-13}$

-continued

| | |
|---|---|
| $C_8 = -5.48081 \times 10^{-17}$ | $C_{10} = 1.67564 \times 10^{-21}$ |
| $C_{12} = -7.84329 \times 10^{-26}$ | $C_{14} = 3.45289 \times 10^{-31}$ |

Surface 29

$\kappa = 0$

| | |
|---|---|
| $C_4 = -8.51910 \times 10^{-9}$ | $C_6 = 6.22456 \times 10^{-14}$ |
| $C_8 = -1.06075 \times 10^{-18}$ | $C_{10} = -1.48912 \times 10^{-23}$ |
| $C_{12} = 3.08241 \times 10^{-28}$ | $C_{14} = 6.15126 \times 10^{-34}$ |

Surface 41

$\kappa = 0$

| | |
|---|---|
| $C_4 = 2.99126 \times 10^{-8}$ | $C_6 = -2.08080 \times 10^{-13}$ |
| $C_8 = 1.23353 \times 10^{-17}$ | $C_{10} = 9.39268 \times 10^{-23}$ |
| $C_{12} = -3.49001 \times 10^{-27}$ | $C_{14} = 4.33883 \times 10^{-31}$ |

Surface 43

$\kappa = 0$

| | |
|---|---|
| $C_4 = -1.36725 \times 10^{-7}$ | $C_6 = -1.96775 \times 10^{-11}$ |
| $C_8 = -2.82153 \times 10^{-15}$ | $C_{10} = -1.38257 \times 10^{-19}$ |
| $C_{12} = 1.66066 \times 10^{-22}$ | $C_{14} = -1.34566 \times 10^{-26}$ |

(Values corresponding to Conditional Expression)

$L = 1250.0003$ mm $$Y_0/L = 0.01688 \qquad (5)$$

Figure 18:
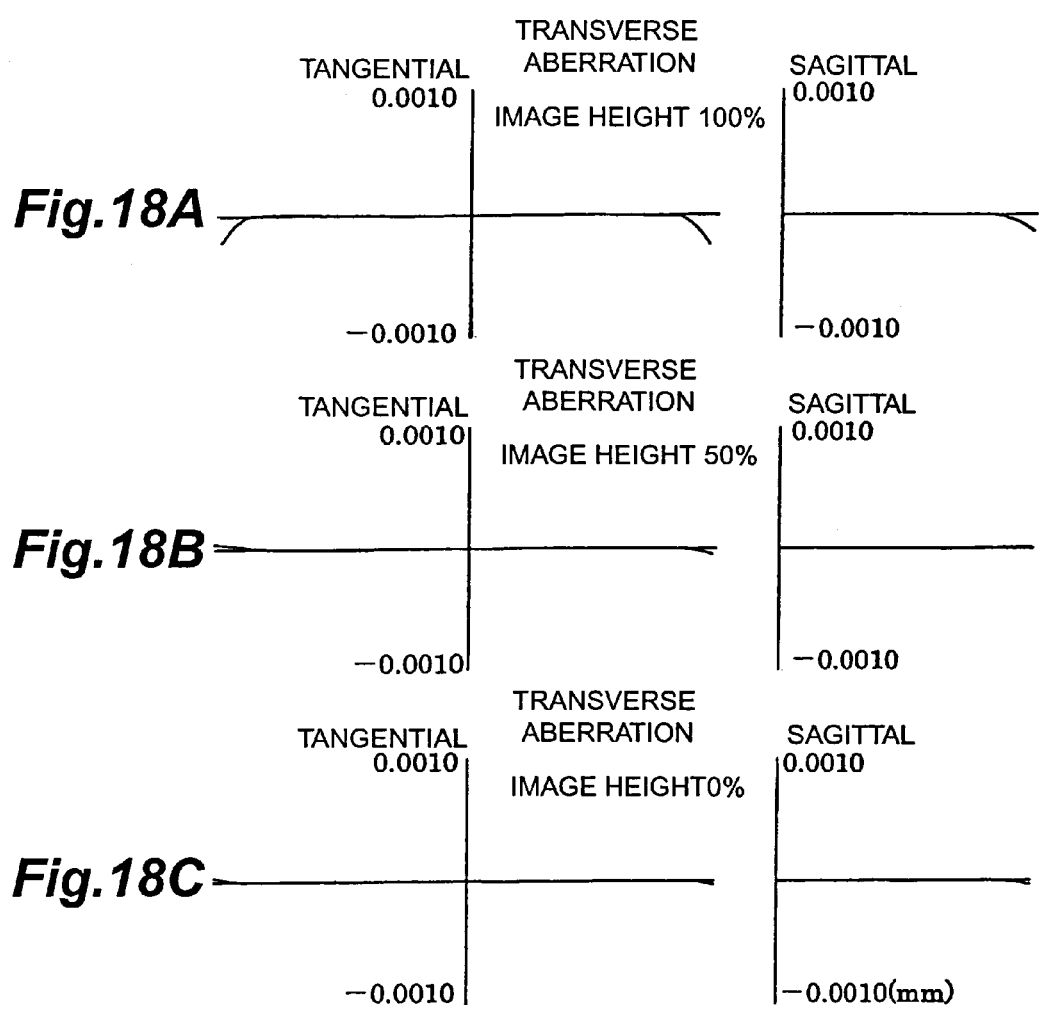

FIGS. 18A–18C are diagrams showing spherical aberration, astigmatism, and distortion, respectively, in the sixth embodiment. It is clearly seen from the aberration diagrams that in the sixth embodiment the various aberrations including distortion are corrected well, while securing the large numerical aperture of NA=0.70 and the large maximum image height (in turn, the large image field) of $Y_0$=21.1

As described above, the projection optical system PL of the sixth embodiment is comprised of the first lens unit GI having the positive refracting power, the second lens unit G2 having the negative refracting power, and the third lens unit G3 having the positive refracting power, named in order from the reticle side, and satisfies the condition below:

$$0.014 < Y_0/L < 0.030 \qquad (5).$$

The conventional projection optical systems with the wide exposure area (imaging area) applied to the step-and-scan method and satisfying the conditional expression (5) employed the five-unit configuration with the layout of positive, negative, positive, negative, and positive refracting powers. However, the sixth embodiment employed the three-unit configuration with the layout of positive, negative, and positive refracting powers, whereby it is feasible to largely decrease the number of components, decrease the production cost, and prevent degradation of the imaging performance due to errors of the element units. When the ratio in the conditional expression (5) exceeds the upper limit, it becomes difficult to implement good correction for aberration across the whole of the imaging area. When the ratio becomes smaller than the lower limit, the size of the projection optical system becomes large and production thereof becomes difficult. In order to achieve the better beneficial effect of the present invention, it is preferable to set the upper limit in the conditional expression (5) to 0.025 and the lower limit to 0.015.

In the sixth embodiment, 80% or more (twelve optical surfaces: 100%) of the total number (=12) of all the optical surfaces constituting the first lens unit G1 have the clear aperture radius larger than 1.1 times the maximum object height $H_0$, 80% or more (seven optical surfaces: 87.5%) of the total number (=8) of the optical surfaces constituting the second lens unit G2 have the clear aperture radius smaller than 1.1 times the maximum object height $H_0$, and 70% or more (twenty optical surfaces: 83.3%) of the total number (=24) of the optical surfaces constituting the third lens unit G3 have the clear aperture radius larger than 1.1 times the maximum object height $H_0$. This configuration permits the sixth embodiment to make good correction for curvature of field by setting the Petzval sum close to 0 even in the three-unit configuration.

Incidentally, also in the aforementioned third embodiment, the lenses L1–L7 constitute the first lens unit G1 having the positive refracting power, the lenses L8–L11 the second lens unit G2 having the negative refracting power, and the lenses L12–L22 the third lens unit G3 having the positive refracting power. In the third embodiment, $Y_0/L = 21.1/1249.9856 = 0.01688$, satisfying the conditional expression (5).

In the third embodiment, 80% or more (fourteen optical surfaces: 100%) of the total number (=14) of all the optical surfaces constituting the first lens unit G1 have the clear aperture radius larger than 1.1 times the maximum object height $H_0$, 80% or more (seven optical surfaces: 87.5%) of the total number (=8) of the optical surfaces constituting the second lens unit G2 have the clear aperture radius smaller than 1.1 times the maximum object height $H_0$, and 70% or more (seventeen optical surfaces: 77.3%) of the total number (=22) of the optical surfaces constituting the third lens unit G3 have the clear aperture radius larger than 1.1 times the maximum object height $H_0$. Therefore, the third embodiment also provides the aforementioned effect of the sixth embodiment.

In the exposure apparatus of the foregoing embodiment, the reticle (mask) is illuminated by the illumination system (illumination step), and the transfer pattern formed on the mask is exposed to the photosensitive substrate by the projection optical system (exposure step), whereby a microdevice (a semiconductor device, an imaging device, a liquid crystal display device, a thin-film magnetic head, or the like) can be fabricated. An example of a technique of forming a predetermined circuit pattern on a wafer or the like as a photosensitive substrate with the exposure apparatus of the present embodiment, thereby obtaining a semiconductor device as a microdevice will be described below with reference to the flowchart of FIG. 19.

Figure 19:
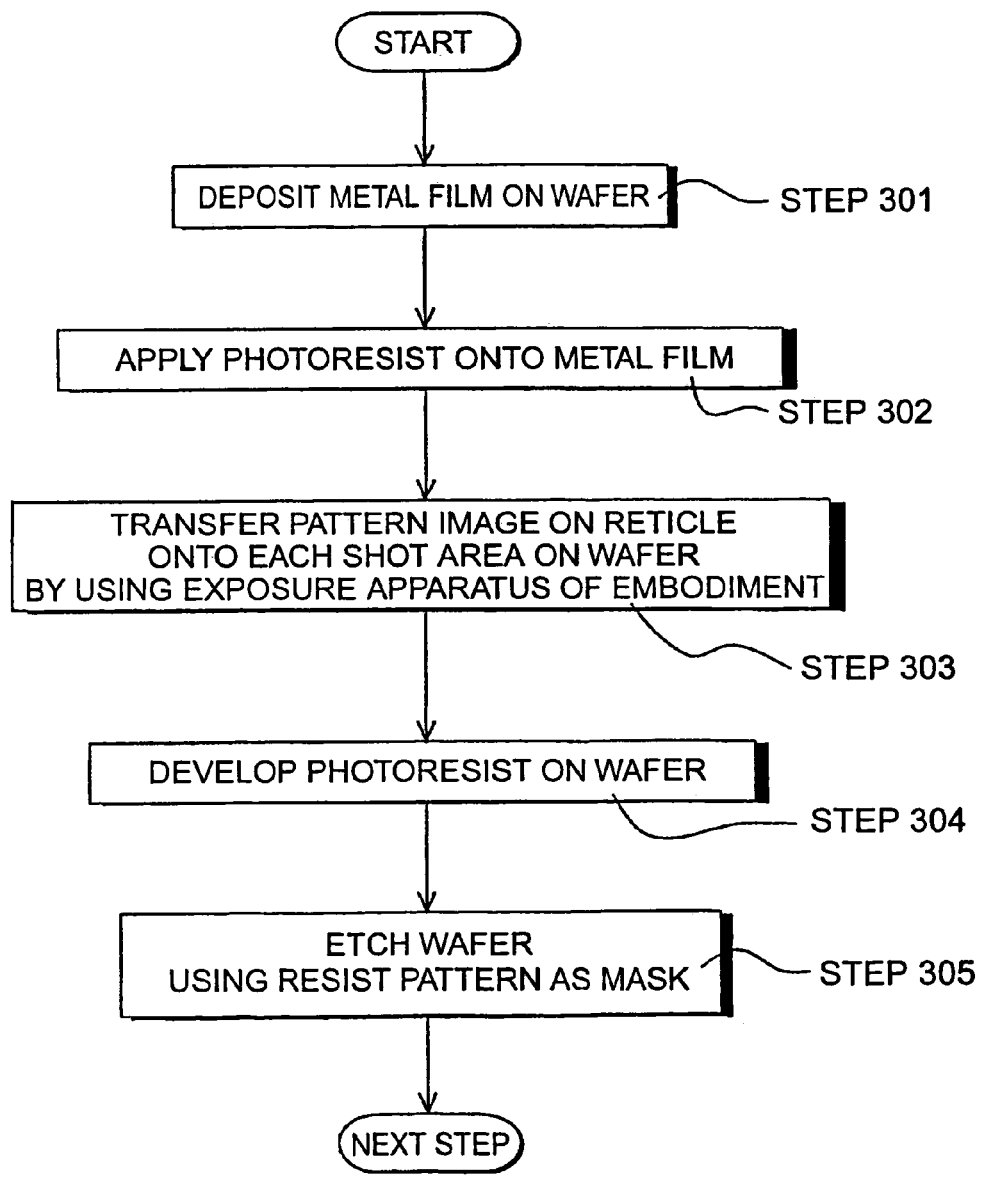
FIG. 19 is a flowchart of a technique of obtaining a semiconductor device as a microdevice.

First, at step 301 in FIG. 19, a metal film is evaporated on one lot of wafers. At subsequent step 302, a photoresist is applied onto the metal film on the lot of wafers. Then, at step 303, using the exposure apparatus of the present embodiment, an image of a pattern on the mask is successively exposed and transferred to each shot area on the lot of wafers by way of the projection optical system. Thereafter, the photoresist on the lot of wafers is developed at step 304, and then at step 305 etching is carried out on the lot of wafers, using the resist pattern as a mask, whereby a circuit pattern corresponding to the pattern on the mask is formed in each shot area on each wafer.

Thereafter, circuit patterns of upper layers are formed and other steps are carried out, thereby producing a device such as a semiconductor device. The above-stated semiconductor device production method can yield semiconductor devices with a microscopic circuit pattern at a high throughput. Step 301 to step 305 were arranged to carry out the step of evaporating metal on each wafer, the step of applying the photoresist onto the metal film, and the subsequent steps of exposure, development, and etching, but it is needless to mention that the steps may be arranged so that, prior to these steps, a silicon oxide film is formed on each wafer, the photoresist is thereafter applied onto the silicon oxide film, and the steps of exposure, development, etching, etc. are carried out subsequent thereto.

Figure 20:
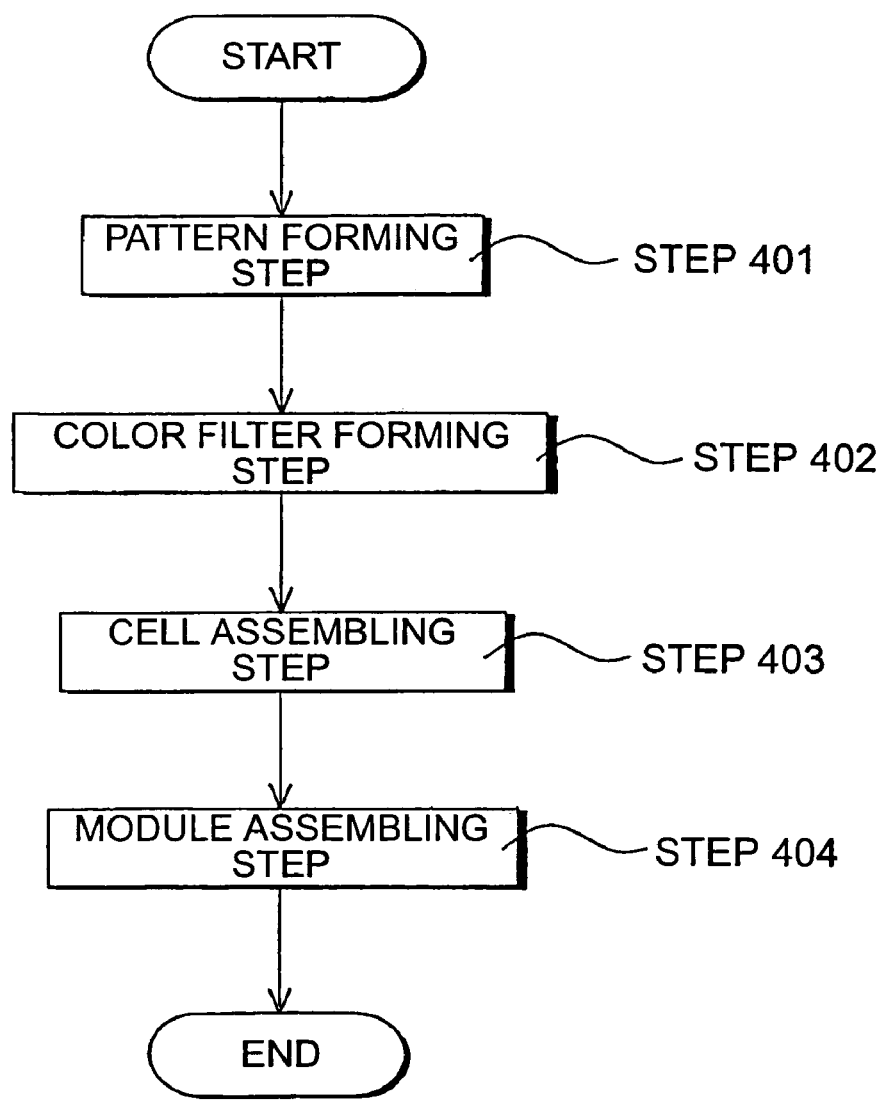
FIG. 20 is a flowchart of a technique of obtaining a liquid crystal display device as a microdevice.

With the exposure apparatus of the present embodiment, a liquid crystal display device as a microdevice can also be fabricated by forming predetermined patterns (a circuit pattern, an electrode pattern, etc.) on a plate (glass substrate). An example of a technique of this fabrication will be described below with reference to the flowchart of FIG. 20. In FIG. 20, pattern forming step 401 is to carry out the so-called photolithography to effect transfer exposure of a pattern of a mask onto a photosensitive substrate (a glass substrate coated with a photoresist, or the like) with the exposure apparatus of the present embodiment. This photolithography step results in forming the predetermined pattern including a number of electrodes and others on the photosensitive substrate. Thereafter, the substrate thus exposed is processed through each of a development step, an etching step, a resist removing step, and so on, so as to form the predetermined pattern on the substrate, and then the flow transfers to next color filter forming step 402.

Next, the color filter forming step 402 is to form a color filter in which a number of sets of three dots corresponding to R (Red), G (green), and B (Blue) are arrayed in a matrix or in which a plurality of sets of three stripe filters of R, G, and B are arranged in the direction of horizontal scanning lines. After the color filter forming step 402, cell assembling step 403 is carried out. The cell assembling step 403 is to assemble a liquid crystal panel (liquid crystal cell), using the substrate with the predetermined pattern obtained by the pattern forming step 401, the color filter obtained by the color filter forming step 402, and others. In the cell assembling step 403, for example, a liquid crystal is charged into between the substrate with the predetermined pattern obtained by the pattern forming step 401 and the color filter obtained by the color filter forming step 402, thereby fabricating the liquid crystal panel (liquid crystal cell).

Thereafter, module assembling step 404 is carried out to mount components such as an electric circuit for display operation of the assembled liquid crystal panel (liquid crystal cell), a backlight, etc., thereby completing a liquid crystal display device. The above-stated production method of the liquid crystal display device can yield liquid crystal display devices with a microscopic circuit pattern at a high throughput.

The above-stated embodiment was the application of the present invention to the step-and-repeat type exposure apparatus for implementing the full-shot exposure of the pattern of the reticle R into each exposure area of wafer W, but, without having to be limited to this, the present invention can also be applied to the step-and-scan type exposure apparatus for implementing scanning exposure of the pattern of the reticle R into each exposure area of wafer W while moving the wafer W and reticle R relative to the projection optical system PL.

The above embodiments used the KrF excimer laser source for supplying the light with the wavelength of 248.4 nm, the ArF excimer laser source for supplying the light with the wavelength of 193.3 nm, or the $F_2$ laser source for supplying the light with the wavelength of 157.6 nm, but, without having to be limited to this, the present invention can also be applied to any other appropriate light source.

Furthermore, the aforementioned embodiments is were the applications of the present invention to the projection optical systems mounted on the exposure apparatus, but, without having to be limited to this, the present invention can also be applied to the other general projection optical systems.

As described above, the present invention has provided the compact, high-performance projection optical system being substantially telecentric on the both sides and well corrected for the various aberrations including distortion, while securing the satisfactorily large numerical aperture and the satisfactorily wide imaging area. Accordingly, the exposure apparatus equipped with the projection optical system of the present invention can implement excellent projection exposure with a high throughput and a high resolving power while suppressing the image distortion due to the warps of the reticle and wafer and others, so as to fabricate excellent microdevices with a high throughput and a high resolving power.

Whereas several preferred embodiments of the present invention and variations thereof have been described above, these examples have been presented merely for purposes of describing the invention and it is not intended that the invention should be limited thereto. The present invention may be carried out in the context of a wide variety of modes and embodiments other than those specifically presented herein.

What is claimed is:

1. A projection optical system for forming an image of a pattern of a first object on a second object, comprising an optical material having a refractive index of not more than 1.6, which is disposed in an optical path between the first object and the second object, said projection optical system being substantially telecentric both on the first object side and on the second object side, and said projection optical system satisfying the condition below:

$(\lambda \times L)/(NA \times Y_0^2) < 1.5 \times 10^{-3}$, where $\lambda$ is a wavelength of light used by the projection optical system, L a distance between the first object and the second object, NA a numerical aperture on the second object side, and $Y_0$ a maximum image height on the second object.

2. The projection optical system according to claim 1, which satisfies the condition below:

$E/L > 1.2$, where E is a distance between an exit pupil of the projection optical system and the second object and L the distance between the first object and the second object.

3. The projection optical system according to claim 2, wherein all optical components constituting the projection optical system are made of an optical material of a single kind.

4. The projection optical system according to claim 3, wherein at least one optical surface is formed in an aspherical shape.

5. The projection optical system according to claim 4, which comprises, in order from the first object side, a first lens unit having a positive refracting power, a second lens unit having a negative refracting power, and a third lens unit having a positive refracting power.

6. The projection optical system according to claim 5, wherein, where $H_0$ represents a maximum object height on the first object, 80% or more of the total number of optical surfaces constituting the first lens unit have a clear aperture radius larger than 1.1 times the maximum object height $H_0$, 80% or more of the total number of optical surfaces constituting the second lens unit have a clear aperture radius smaller than 1.1 times the maximum object height $H_0$, and 70% or more of the total number of optical surfaces constituting the third lens unit have a clear aperture radius larger than 1.1 times the maximum object height $H_0$.

7. The projection optical system according to claim 6, wherein the first lens unit is disposed nearest to the first object among the lens units belonging to the projection optical system, and wherein the third lens unit is disposed nearest to the second object among the lens units belonging to the projection optical system.

8. An exposure apparatus comprising:

an illumination system for illuminating the first object; and the projection optical system as set forth in claim 7, for forming an image of a pattern formed on the first object, on the second object.

9. The exposure apparatus according to claim 8, said exposure apparatus implementing exposure in a state in which the first object and the second object are stationary relative to each other with respect to a transverse direction to the optical axis of the projection optical system.

10. A device production method comprising:

an illumination step of illuminating the first object;

an exposure step of implementing exposure of a pattern of the first object illuminated by the illumination step, to the second object by way of the projection optical system as set forth in claim 7; and a development step of developing the second object exposed by the exposure step.

11. The device production method according to claim 10, wherein said exposure step is to implement the exposure in a state in which the first object and the second object are stationary relative to each other with respect to a transverse direction to the optical axis of the projection optical system.

12. The projection optical system according to claim 1, wherein all optical components constituting the projection optical system are made of an optical material of a single kind.

13. The projection optical system according to claim 1, wherein at least one optical surface is formed in an aspherical shape.

14. The projection optical system according to claim 1, which comprises, in order from the first object side, a first lens unit having a positive refracting power, a second lens unit having a negative refracting power, and a third lens unit having a positive refracting power.

15. The projection optical system according to claim 14, wherein, where $H_0$ represents a maximum object height on the first object, 80% or more of the total number of optical surfaces constituting the first lens unit have a clear aperture radius larger than 1.1 times the maximum object height $H_0$, 80% or more of the total number of optical surfaces constituting the second lens unit have a clear aperture radius smaller than 1.1 times the maximum object height $H_0$, and 70% or more of the total number of optical surfaces constituting the third lens unit have a clear aperture radius larger than 1.1 times the maximum object height $H_0$.

16. The projection optical system according to claim 15, wherein the first lens unit is disposed nearest to the first object among the lens units belonging to the projection optical system, and wherein the third lens unit is disposed nearest to the second object among the lens units belonging to the projection optical system.

17. The projection optical system according to claim 1, wherein a reduced image of the first object is formed on the second object.

18. An exposure apparatus comprising:

an illumination system for illuminating the first object; and the projection optical system as set forth in claim 1, for forming an image of a pattern formed on the first object, on the second object.

19. The exposure apparatus according to claim 18, said exposure apparatus implementing exposure in a state in which the first object and the second object are stationary relative to each other with respect to a transverse direction to the optical axis of the projection optical system.

20. A device production method comprising:

an illumination step of illuminating the first object;

an exposure step of implementing exposure of a pattern of the first object illuminated by the illumination step, to the second object by way of the projection optical system as set forth in claim 1; and a development step of developing the second object exposed by the exposure step.

21. The device production method according to claim 20, wherein said exposure step is to implement the exposure in a state in which the first object and the second object are stationary relative to each other with respect to a transverse direction to the optical axis of the projection optical system.

22. A projection optical system for forming an image of a pattern of a first object on a second object, comprising an optical material disposed in an optical path between the first object and the second object; and at least one optical surface formed in an aspherical shape, said projection optical system being substantially telecentric both on the first object side and on the second object side, said projection optical system satisfying the conditions below:

$(\lambda \times L)/(NA \times Y_0^2) < 1.0 \times 10^{-3}$, and $\lambda < 200$ nm, where $\lambda$ is a wavelength of light used by the projection optical system, L a distance between the first object and the second object, NA a numerical aperture on the second object side, and $Y_0$ a maximum image height on the second object.

23. The projection optical system according to claim 22, wherein a reduced image of the first object is formed on the second object.

24. An exposure apparatus comprising:

an illumination system for illuminating the first object; and the projection optical system as set forth in claim 22, for forming an image of a pattern formed on the first object, on the second object.

25. The exposure apparatus according to claim 24, said exposure apparatus implementing exposure in a state in which the first object and the second object are stationary relative to each other with respect to a transverse direction to the optical axis of the projection optical system.

26. A device production method comprising:
an illumination step of illuminating the first object;
an exposure step of implementing exposure of a pattern of the first object illuminated by the illumination step, to the second object by way of the projection optical system as set forth in claim 22; and
a development step of developing the second object exposed by the exposure step.

27. The device production method according to claim 26, wherein said exposure step is to implement the exposure in a state in which the first object and the second object are stationary relative to each other with respect to a transverse direction to the optical axis of the projection optical system.

28. A projection optical system for forming an image of a pattern of a first object on a second object, comprising the following lens units in order from the first object side:
a first lens unit having a positive refracting power;
a second lens unit having a negative refracting power; and
a third lens unit having a positive refracting power,
said projection optical system satisfying the condition below:

$0.014 < Y_0/L < 0.030$, where $Y_0$ is a maximum image height on the second object and L a distance between the first object and the second object.

29. The projection optical system according to claim 28, wherein, where $H_0$ represents a maximum object height on the first object,
80% or more of the total number of optical surfaces constituting the first lens unit have a clear aperture radius larger than 1.1 times the maximum object height $H_0$,
80% or more of the total number of optical surfaces constituting the second lens unit have a clear aperture radius smaller than 1.1 times the maximum object height $H_0$, and
70% or more of the total number of optical surfaces constituting the third lens unit have a clear aperture radius larger than 1.1 times the maximum object height $H_0$.

30. The projection optical system according to claim 29, wherein the first lens unit is disposed nearest to the first object among the lens units belonging to the projection optical system, and
wherein the third lens unit is disposed nearest to the second object among the lens units belonging to the projection optical system.

31. The projection optical system according to claim 30, wherein a reduced image of the first object is formed on the second object.

32. An exposure apparatus comprising:
an illumination system for illuminating the first object; and
the projection optical system as set forth in claim 31, for forming an image of a pattern formed on the first object, on the second object.

33. The exposure apparatus according to claim 32, said exposure apparatus implementing exposure in a state in which the first object and the second object are stationary relative to each other with respect to a transverse direction to the optical axis of the projection optical system.

34. A device production method comprising:
an illumination step of illuminating the first object;
an exposure step of implementing exposure of a pattern of the first object illuminated by the illumination step, to the second object by way of the projection optical system as set forth in claim 31; and
a development step of developing the second object exposed by the exposure step.

35. The device production method according to claim 34, wherein said exposure step is to implement the exposure in a state in which the first object and the second object are stationary relative to each other with respect to a transverse direction to the optical axis of the projection optical system.

36. The projection optical system according to claim 28, wherein the first lens unit is disposed nearest to the first object among the lens units belonging to the projection optical system, and
wherein the third lens unit is disposed nearest to the second object among the lens units belonging to the projection optical system.

37. An exposure apparatus comprising:
an illumination system for illuminating the first object; and
the projection optical system as set forth in claim 28, for forming an image of a pattern formed on the first object, on the second object.

38. The exposure apparatus according to claim 37, said exposure apparatus implementing exposure in a state in which the first object and the second object are stationary relative to each other with respect to a transverse direction to the optical axis of the projection optical system.

39. A device production method comprising:
an illumination step of illuminating the first object;
an exposure step of implementing exposure of a pattern of the first object illuminated by the illumination step, to the second object by way of the projection optical system as set forth in claim 28; and
a development step of developing the second object exposed by the exposure step.

40. The device production method according to claim 39, wherein said exposure step is to implement the exposure in a state in which the first object and the second object are stationary relative to each other with respect to a transverse direction to the optical axis of the projection optical system.

41. An exposure method of implementing projection exposure of a pattern on a mask onto a photosensitive substrate, comprising:
an illumination step of illuminating the mask with use of an illumination system; and
a projection step of forming a reduced image of the pattern of the mask on the photosensitive substrate with use of a projection optical system,
wherein the projection optical system is made of an optical material having a refractive index of not more than 1.6 and is substantially telecentric both on the mask side and on the photosensitive substrate side, and
wherein the projection optical system satisfies the condition below:

$(\lambda \times L)/(NA \times Y_0^2) < 1.5 \times 10^{-3}$, where $\lambda$ is a wavelength of light from the illumination system, L a distance between the mask and the image of the mask, NA a numerical aperture on the photosensitive substrate side, and $Y_0$ a maximum image height on the photosensitive substrate.

42. The exposure method according to claim 41, wherein the projection step is to implement exposure in a state in which the mask and the photosensitive substrate are stationary relative to each other with respect to a transverse direction to the optical axis of the projection optical system.

43. An exposure method of implementing projection exposure of a pattern on a mask onto a photosensitive substrate, comprising:

an illumination step of illuminating the mask with use of an illumination system; and a projection step of forming a reduced image of the pattern of the mask on the photosensitive substrate with use of a projection optical system, wherein the projection optical system is made of an optical material having a refractive index of not more than 1.6, is substantially telecentric both on the mask side and on the photosensitive substrate side, and has at least one optical surface formed in an aspherical shape, and wherein the projection optical system satisfies the conditions below:

$(\lambda \times L)/(NA \times Y_0^2) < 1.0 \times 10^{-3}$, and $\lambda < 200$ nm, where $\lambda$ is a wavelength of light from the illumination system, L a distance between the mask and the image of the mask, NA a numerical aperture on the photosensitive substrate side, and $Y_0$ a maximum image height on the photosensitive substrate.

44. The exposure method according to claim 43, wherein the projection step is to implement exposure in a state in which the mask and the photosensitive substrate are stationary relative to each other with respect to a transverse direction to the optical axis of the projection optical system.

45. An exposure method of implementing projection exposure of a pattern on a mask onto a photosensitive substrate, comprising:

a step of positioning the mask on a first surface;

a step of positioning the photosensitive substrate on a second surface;

an illumination step of illuminating the mask; and a projection step of forming a reduced image of the pattern of the mask on the photosensitive substrate with use of a projection optical system;

wherein the projection optical system comprises a first lens unit disposed in an optical path between the first surface and the second surface and having a positive refracting power, a second lens unit disposed in an optical path between the first lens unit and the second surface and having a negative refracting power, and a third lens unit disposed in an optical path between the second lens unit and the second surface and having a positive refracting power, and wherein the projection optical system satisfies the condition below:

$0.014 < Y_0/L < 0.030$, where $Y_0$ is a maximum image height on the photosensitive substrate and L a distance between the mask and the photosensitive substrate.

46. The exposure method according to claim 45, wherein the projection step is to implement exposure in a state in which the mask and the photosensitive substrate are stationary relative to each other with respect to a transverse direction to the optical axis of the projection optical system.

* * * * *